US012674921B2

(12) United States Patent
Lee et al.

(10) Patent No.: US 12,674,921 B2
(45) Date of Patent: Jul. 7, 2026

(54) DISPLAY PANEL AND MANUFACTURING METHOD THEREFOR

(71) Applicant: Samsung Display Co., Ltd., Yongin-si (KR)

(72) Inventors: Seon Uk Lee, Seongnam-si (KR); Donchan Cho, Seongnam-si (KR); Kanguk Kim, Hwaseong-si (KR); Yeogeon Yoon, Seoul (KR); Tae Hyung Hwang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 512 days.

(21) Appl. No.: 18/025,999

(22) PCT Filed: Jan. 18, 2021

(86) PCT No.: PCT/KR2021/000654
§ 371 (c)(1),
(2) Date: Mar. 13, 2023

(87) PCT Pub. No.: WO2022/075534
PCT Pub. Date: Apr. 14, 2022

(65) Prior Publication Data
US 2023/0413636 A1 Dec. 21, 2023

(30) Foreign Application Priority Data

Oct. 6, 2020 (KR) ........................ 10-2020-0128799

(51) Int. Cl.
*G02B 5/20* (2006.01)
*H10K 59/12* (2023.01)
(Continued)

(52) U.S. Cl.
CPC ......... *G02B 5/201* (2013.01); *H10K 59/1201* (2023.02); *H10K 59/122* (2023.02);
(Continued)

(58) Field of Classification Search
CPC .. G02B 5/201; H01K 59/1201; H01K 59/122; H01K 59/877; H01K 59/38; H01K 59/80; H01K 59/8792; H01K 59/8731
See application file for complete search history.

(56) References Cited

U.S. PATENT DOCUMENTS 10,043,442 B2 8/2018 Hsu
10,216,037 B2 2/2019 Kim et al.
(Continued)

FOREIGN PATENT DOCUMENTS

JP 6349406 B2 6/2018
KR 10-2007-0049172 A 5/2007
(Continued)

OTHER PUBLICATIONS

International Search Report mailed Jul. 2, 2021 for PCT/KR2021/000654.

*Primary Examiner* — Mary Ellen Bowman
(74) *Attorney, Agent, or Firm* — CANTOR COLBURN LLP

(57) ABSTRACT

A display panel includes a first pixel area and a second pixel area. A division partition wall includes an opening corresponding to at least the first pixel area. A light conversion pattern for changing the color of source light is disposed inside the opening. An optical pattern is arranged to correspond to the second pixel area. The optical pattern transmits the source light therethrough. The optical pattern may have a shape integrally formed with or different from the division partition wall.

17 Claims, 23 Drawing Sheets

(51) Int. Cl.
| | |
|---|---|
| *H10K 59/122* | (2023.01) |
| *H10K 59/38* | (2023.01) |
| *H10K 59/80* | (2023.01) |

(52) U.S. Cl.
CPC ............. *H10K 59/38* (2023.02); *H10K 59/80* (2023.02); *H10K 59/877* (2023.02); *H10K 59/8792* (2023.02); *H10K 59/8731* (2023.02)

(56)      References Cited

U.S. PATENT DOCUMENTS

| | | | |
|---|---|---|---|
| 10,692,938 | B2 | 6/2020 | Kim |
| 10,725,333 | B2 | 7/2020 | Kim et al. |
| 10,847,583 | B2 | 11/2020 | Sung et al. |
| 10,950,667 | B2 | 3/2021 | Joo et al. |
| 11,204,518 | B2 | 12/2021 | Lee et al. |
| 2008/0036367 | A1 | 2/2008 | Eida et al. |
| 2012/0098414 | A1* | 4/2012 | Nakamura ........... H10K 59/122 445/24 |
| 2018/0182827 | A1* | 6/2018 | Kim ..................... H10K 59/353 |
| 2019/0025655 | A1 | 1/2019 | Kim et al. |
| 2020/0257162 | A1* | 8/2020 | Lee ...................... H10K 50/115 |
| 2020/0273929 | A1* | 8/2020 | Kim ....................... H10K 59/38 |
| 2020/0303465 | A1* | 9/2020 | Joo .................... H10K 59/8792 |

FOREIGN PATENT DOCUMENTS

| | | | |
|---|---|---|---|
| KR | 10-2020-0001598 | A | 1/2010 |
| KR | 1020100001598 | A | 1/2010 |
| KR | 10-2011-0108049 | A | 10/2011 |
| KR | 10-2012-0111912 | A | 10/2012 |
| KR | 10-2016-0017373 | A | 2/2016 |
| KR | 10-2017-0096583 | A | 8/2017 |
| KR | 10-2018-0066936 | A | 6/2018 |
| KR | 10-2018-0075958 | A | 7/2018 |
| KR | 10-2018-0092326 | A | 8/2018 |
| KR | 10-2020-0097379 | A | 8/2020 |
| KR | 10-2020-0104974 | A | 9/2020 |
| KR | 10-2020-0111325 | A | 9/2020 |

* cited by examiner

DISPLAY PANEL AND MANUFACTURING METHOD THEREFOR

TECHNICAL FIELD

Embodiments of the invention relate to a display panel, and more particularly, to a display panel including a light conversion pattern and a method for manufacturing the display panel.

BACKGROUND ART

A display panel includes a transmissive display panel that selectively transmits source light generated from a light source and an emission type display panel that generates source light in the display panel itself. The display panel may include different kinds of light control patterns according to pixels that generate a color image. The light control patterns may transmit only source light in a partial wavelength length or convert a color of the source light. A portion of the light control pattern may not convert the color of the source light but convert properties of the light.

DISCLOSURE OF THE INVENTION

Technical Problem

An embodiment of the invention is to provide a display panel having high resolution.

An embodiment of the invention is to provide a method for manufacturing a display using a solution process and a photo process.

Technical Solution

A display panel according to an embodiment of the invention includes a first pixel area, a second pixel area, a third pixel area, and a peripheral area adjacent to the first, second, and third pixel areas. In such an embodiment, the display panel includes: a first light emitting element, a second light emitting element, and a third light emitting element, each of which generates source light and which correspond to the first pixel area, the second pixel area, and the third pixel area, respectively; a division partition wall in which first openings corresponding to the first pixel area and the second pixel area are defined and which overlaps the peripheral area and the third pixel area; a color filter overlapping the first pixel area and the second pixel area; a division pattern in which second openings corresponding to at least the first openings are defined; a first light conversion pattern disposed inside an opening corresponding to the first pixel area among the first openings, where the first light conversion pattern converts the source light generated in the first light emitting element into first color light; and a second light conversion pattern disposed inside an opening corresponding to the second pixel area among the first openings, where the second light conversion pattern converts the source light generated in the first light emitting element into second color light.

According to an embodiment of the invention, the first pixel area may be spaced apart from the second pixel area in a first direction, and the third pixel area may be spaced apart from the first pixel area and the second pixel area in a second direction crossing the first direction.

According to an embodiment of the invention, a length of each of the first pixel area and the second pixel area in the first direction may be less than a length of the third pixel area in the first direction, and a length of each of the first pixel area and the second pixel area in the second direction may be greater than a length of the third pixel area in the second direction.

According to an embodiment of the invention, the first pixel area, the second pixel area, and the third pixel area may define a unit area, and the unit area may be provided in plurality, where the plurality of unit areas may define a plurality of unit pixel rows.

According to an embodiment of the invention, the plurality of unit areas may have a same arrangement pattern of the first pixel area, the second pixel area, and the third pixel area as each other.

According to an embodiment of the invention, an arrangement pattern of the first pixel area, the second pixel area, and the third pixel area of a unit area in an n-th unit pixel row of the plurality of unit pixel rows may be symmetric with respect to an arrangement pattern of the first pixel area, the second pixel area, and the third pixel area of a unit area in an (n+1)-th unit pixel row in the first direction, where n is a natural number greater than or equal to 1.

According to an embodiment of the invention, a thickness deviation of the division partition wall corresponding to the third pixel area of the plurality of unit areas may be less than a thickness deviation of the first light conversion pattern corresponding to the first pixel area of the plurality of unit areas.

According to an embodiment of the invention, a top surface of the division partition wall corresponding to the third pixel area may be flatter than a top surface of the first light conversion pattern.

According to an embodiment of the invention, the color filter may include a first color filter which transmits the first color light and a second color filter which transmits the second color light, and a portion of the division pattern may overlap the third pixel area and transmits the source light passed through the division partition wall.

According to an embodiment of the invention, the display panel may further include a reflective layer disposed on an inner wall surface of the division partition wall defining the first openings.

According to an embodiment of the invention, the division partition wall may include a first region having hydrophilicity and a second region extending from the first region and having hydrophobicity.

According to an embodiment of the invention, the division partition wall may include a first layer having hydrophilicity and a second layer disposed on the first layer and having hydrophobicity.

According to an embodiment of the invention, the division partition wall may include a base resin and scattering particles mixed with the base resin.

According to an embodiment of the invention, a portion of the division partition wall overlapping the third pixel area may have a thickness greater than a thickness of the first light conversion pattern.

A display panel according to an embodiment of the invention may include a first pixel area, a second pixel area, and a peripheral area adjacent to the first and second pixel areas. In such an embodiment, the display panel includes: a first display element and a second display element, each of which provides source light and which correspond to the first pixel area and the second pixel area, respectively; a division partition wall which overlaps the peripheral area and in which first openings corresponding to the first pixel area and the second pixel area are defined; a division pattern in which a second opening corresponding to at least the first pixel area is defined; a light conversion pattern disposed inside an opening corresponding to the first pixel area among the first openings, wherein the light conversion pattern converts a color of the source light received from the first display element; and an optical pattern disposed inside an opening corresponding to the second pixel area among the first openings, where the optical pattern transmits the source light received from the second display element. In such an embodiment, a portion of the optical pattern overlaps the division partition wall on a plane.

According to an embodiment of the invention, the optical pattern may include an organic material pattern.

According to an embodiment of the invention, the display panel may further include scattering particles mixed with at least one of a portion of the division pattern overlapping the second pixel area or the organic material pattern.

According to an embodiment of the invention, the optical pattern may have a thickness greater than a thickness of the light conversion pattern.

A method for manufacturing a display panel according to an embodiment of the invention includes: providing a division partition wall in which openings corresponding to the first pixel area and the second pixel area are defined and which overlaps the peripheral area and the third pixel area; and providing light conversion patterns, which convert a color of incident light, inside the openings. In such an embodiment, the providing the light conversion patterns includes providing a liquid quantum dot composition into the first openings.

A method for manufacturing a display panel according to an embodiment of the invention includes: providing a division partition wall in which openings corresponding to the first pixel area and the second pixel area are defined; forming a light conversion pattern, which converts a color of incident light, inside an opening corresponding to the first pixel area among the openings; and providing an optical pattern which transmits the incident light to correspond to an opening corresponding to the second pixel area among the openings. In such an embodiment, the providing the light conversion pattern includes providing a liquid quantum dot composition into the opening corresponding to the first pixel area, and the providing the optical pattern includes performing a photolithography process.

Advantageous Effects

The first light conversion pattern and the second light conversion pattern, which respectively correspond to the first pixel area and the second pixel area, may be formed using the solution process. The light transmitting portion (or light transmitting pattern) corresponding to the third pixel area may be formed using the photo process. The design margin for the solution process may increase because the light transmitting portion is non-aligned with the first light conversion pattern and the second light conversion pattern. The light transmitting portion may be formed at the same time as the division partition wall, and thus, the manufacturing cost may be reduced.

BRIEF DESCRIPTION OF THE DRAWINGS

FIGS. 5A to 5D are views illustrating a method for manufacturing a second display substrate according to an embodiment of the invention.

FIGS. 11A to 11D are views illustrating a method for manufacturing a light conversion pattern illustrated in FIG. 10C.

MODE FOR CARRYING OUT THE INVENTION

Figure 1A:
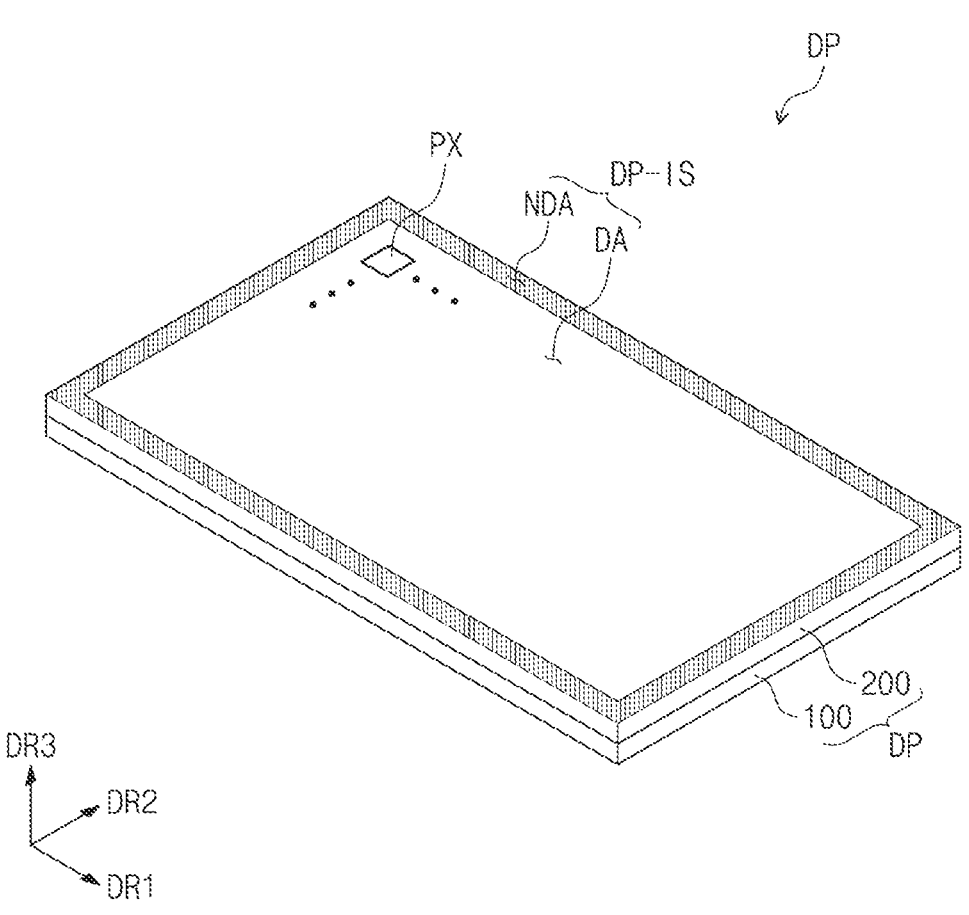
FIG. 1A is a perspective view of a display panel according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will also be understood that when one component (or region, layer, portion) is referred to as being "on", "connected to", or "coupled to" another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration. The term "and/or" includes any and all combinations of one or more of the associated elements.

It will be understood that although the terms such as 'first' and 'second' are used herein to describe various elements, these elements should not be limited by these terms. These terms are used only to distinguish one component from other components. For example, a first element referred to as a first element in an embodiment can be referred to as a second element in another embodiment without departing from the scope of the appended claims. The terms of a singular form may include plural forms unless referred to the contrary.

Also, ""under", "below", "above", "upper", and the like are used for explaining relation association of the elements illustrated in the drawings. The terms may be a relative concept and described based on directions expressed in the drawings.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by a person of ordinary skill in the art to which the invention belongs. In addition, terms such as terms defined in commonly used dictionaries should be interpreted as having a meaning consistent with the meaning in the context of the related technology, and unless explicitly defined here, they are interpreted as too ideal or too formal sense.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 1B:
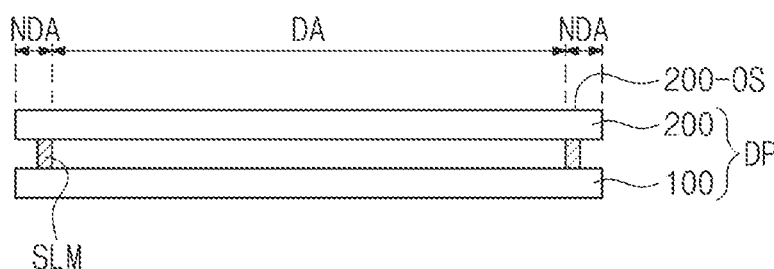
FIG. 1B is a cross-sectional view of the display panel according to an embodiment of the invention.
Figure 2:
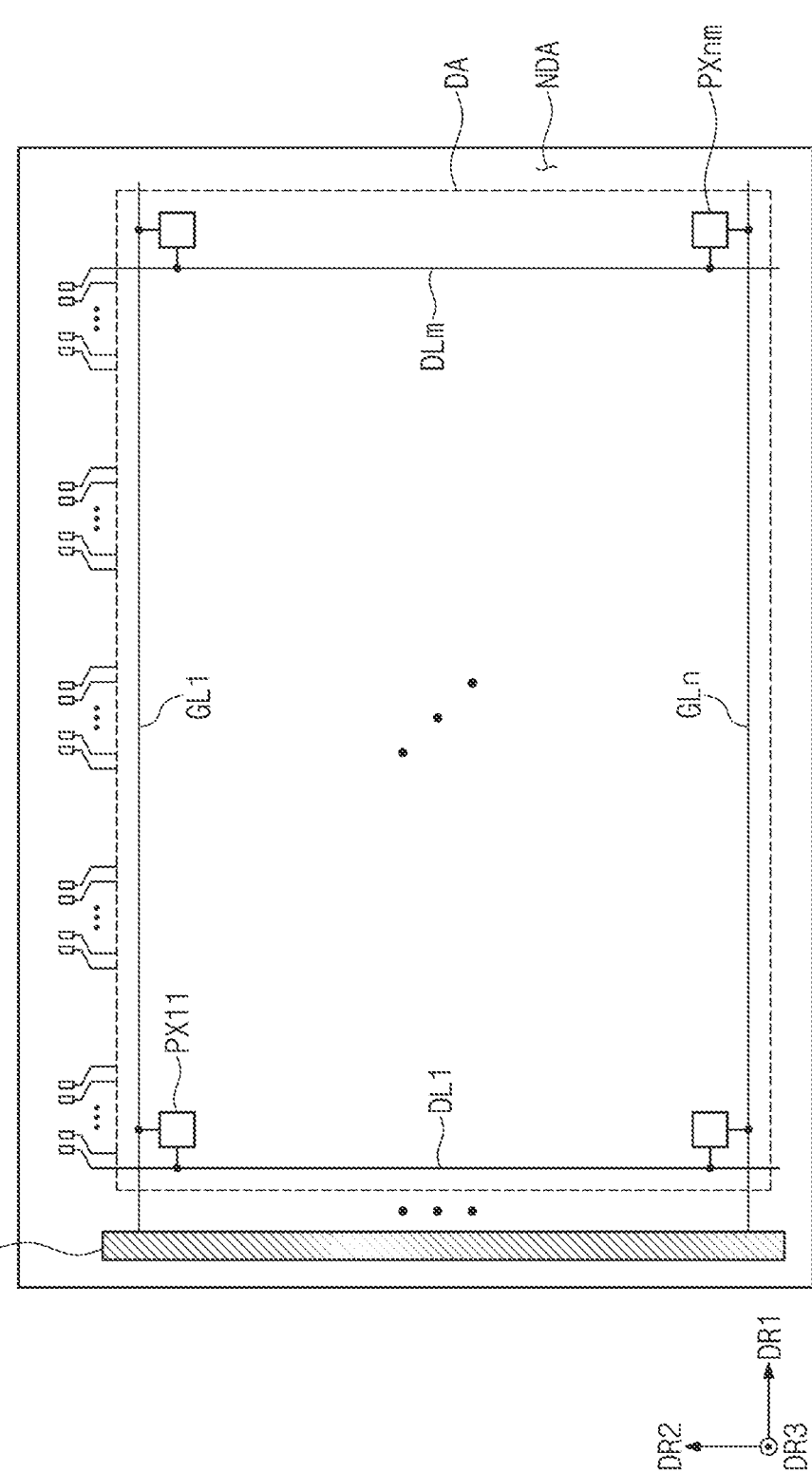
FIG. 2 is a plan view of the display panel according to an embodiment of the invention.

FIG. 1A is a perspective view of a display panel DP according to an embodiment of the invention. FIG. 1B is a cross-sectional view of the display panel DP according to an embodiment of the invention. FIG. 2 is a plan view of the display panel according to an embodiment of the invention.

Figure 1B:
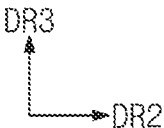

Referring to FIGS. 1A to 2, an embodiment of the display panel DP may be one of a liquid crystal display panel, an electrophoretic display panel, a microelectromechanical system (MEMS) display panel, an electrowetting display panel, a quantum dot light emitting display panel, and an organic light emitting display panel, but is not specifically limited thereto.

Although not separately shown, the display panel DP may further include a chassis member of a molding member and also may further include a backlight unit according to a kind of display panel DP.

The display panel DP may include a first display substrate 100 (or a lower display substrate) and a second display substrate 200 (or an upper display substrate) spaced apart from the first display substrate 100 to face the first display substrate 100. A predetermined cell gap may be defined between the first display substrate 100 and the second display substrate 200. The cell gap may be maintained by a sealant SLM through which the first display substrate 100 and the second display substrate 200 are coupled to each other. An insulating material may be filled in the cell gap.

A grayscale display layer for generating an image may be disposed between a base substrate of the first display substrate 100 and a base substrate of the second display substrate 200. The grayscale display layer may include a liquid crystal layer, an organic light emitting layer, an inorganic light emitting layer (e.g., a quantum dot light emitting layer or a light emitting diode (LED) light emitting layer), and an electrophoretic layer according to the types of the display panel.

As illustrated in FIG. 1A, an embodiment of the display panel DP may display an image through a display surface DP-IS. An outer surface 200-OS of the second display substrate 200 illustrated in FIG. 1B may be defined as the display surface DP-IS of FIG. 1A.

The display surface DP-IS is parallel to a surface defined by a first directional axis DR1 and a second directional axis DR2. The display panel DP may include a display area DA and a non-display area NDA. A pixel PX is disposed in the display area DA and is not disposed in the non-display area NDA. The non-display area NDA is defined along an edge of the display surface DP-IS. The non-display area NDA may surround the display area DA. In an embodiment of the invention, the non-display area NDA may be omitted or may be disposed at only one side of the display area DA.

A normal direction of the display surface DP-IS, i.e., a thickness direction of the display panel DP, is indicated as a third directional axis DR3. A front surface (or a top surface) and a rear surface (or a bottom surface) of each of layers or units, which will be described below, are distinguished by the third directional axis DR3. However, the first to third directional axes illustrated in this embodiment may be merely examples. Hereinafter, first to third directions may be directions indicated by the first to third directional axes DR1, DR2, and DR3 and designated by the same reference numerals, respectively.

Although embodiments of the display panel DP having a planar display surface DP-IS is illustrated, the embodiment of the invention is not limited thereto. The display panel DP may include a curved display surface or a solid display surface. The solid display surface may include a plurality of display areas that indicate different directions.

FIG. 2 illustrates an arrangement relationship between signal lines GL1 to GLn and DL1 to DLm and pixels PX11 to PXnm on a plane. The signal lines GL1 to GLn and DL1 to DLm may include a plurality of gate lines GL1 to GLn, and a plurality of data lines DL1 to DLm.

Each of the pixels PX11 to PXnm are connected to the corresponding gate lines of the plurality of gate lines GL1 to GLn and the corresponding data lines of the plurality of data lines DL1 to DLm, respectively. Each of the pixels PX11 to PXnm may include a pixel driver circuit and a display element. Other kinds of signal lines may be provided on the display panel DP according to a configuration of the pixel driving circuit of the pixels PX11 to PXnm.

Figure 3A:
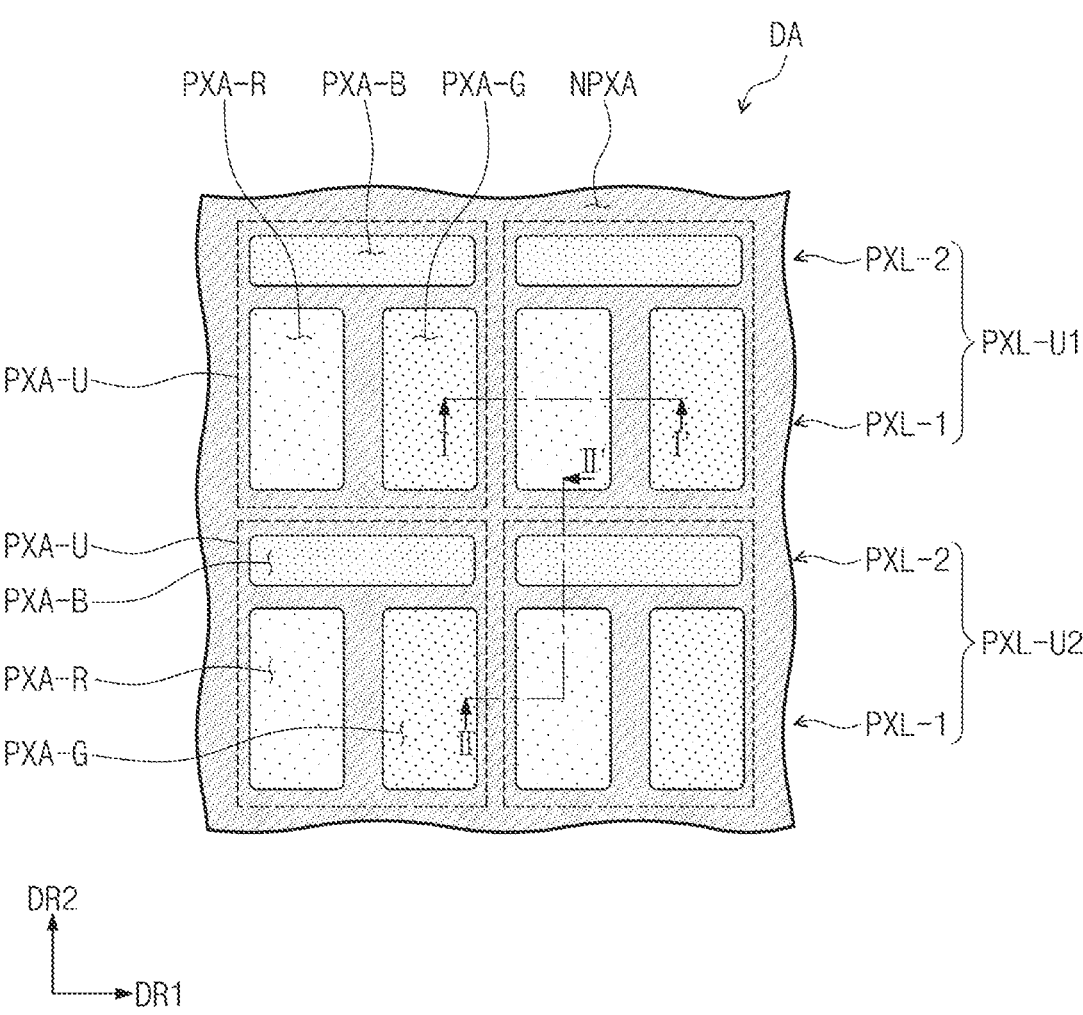
FIG. 3A is a plan view of a display area according to an embodiment of the invention.
Figure 3B:
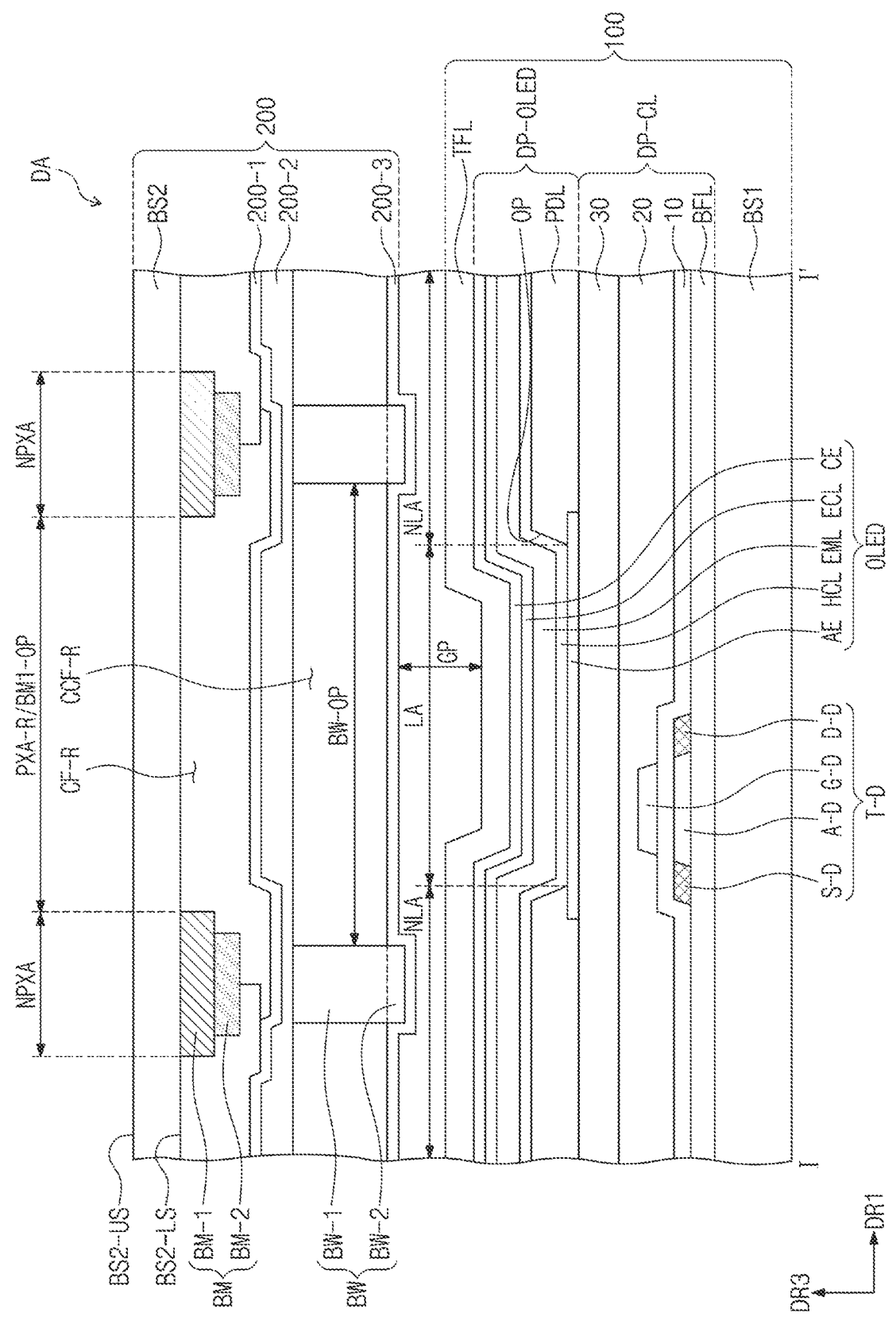
FIG. 3B is a cross-sectional view of the display panel, taken along line I-I' of FIG. 3A, according to an embodiment of the invention.

FIG. 3A is a plan view of the display DA of the display panel DP area according to an embodiment of the invention. FIG. 3B is a cross-sectional view of the display panel DP, taken along line I-I' of FIG. 3A, according to an embodiment of the invention.

A plurality of pixel areas PXA-R, PXA-G, and PXA-B illustrated in FIG. 3A are illustrated in a shape that is viewed on the outer surface 200-OS of the second display substrate 200 illustrated in FIG. 1B. A peripheral area NPXA is disposed adjacent to the plurality of pixel areas PXA-R, PXA-G, and PXA-B. The peripheral area NPXA sets or defines a boundary between the first to third pixel areas PXA-R, PXA-G, and PXA-B to prevent colors from being mixed with each other between the first to third pixel areas PXA-R, PXA-G, and PXA-B.

The first pixel area PXA-R and the second pixel area PXA-G are spaced apart from each other in the first direction DR1. A plurality of first pixel areas PXA-R and a plurality of second pixel areas PXA-G are alternately disposed in the first direction DR1 in one pixel row. This pixel row may be defined as a first pixel row PXL-1.

A plurality of third pixel areas PXA-B are arranged in the first direction DR1 in one pixel row. This pixel row may be defined as a second pixel row PXL-2. One third pixel area PXA-B is disposed to correspond to the pair of first pixel areas PXA-R and second pixel areas PXA-G. The third pixel area PXA-B is disposed to be spaced apart from the first pixel area PXA-R and the second pixel area PXA-G in the second direction DR2.

One first pixel area PXA-R, one second pixel area PXA-G, and one third pixel area PXA-B, which are adjacent to each other, constitute one unit area (or one unit pixel area) PXA-U. The plurality of unit areas PXA-U are arranged along the first direction DR1. The plurality of unit areas PXA-U may define unit pixel rows PXL-U1 and PXL-U2. The plurality of unit pixel rows PXL-U1 and PXL-U2 are arranged along the second direction DR2. In FIG. 3A, the first unit pixel row PXL-U1 and the second unit pixel row PXL-U2 are exemplarily illustrated.

The first pixel area PXA-R, the second pixel area PXA-G, and the third pixel area PXA-B of the unit areas PXA-U of the plurality of unit pixel rows PXL-U1 and PXL-U2 may have the same arrangement pattern as each other.

A pixel PX (see FIG. 1A) is disposed on each of the first pixel area PXA-R, the second pixel area PXA-G, and the third pixel area PXA-B. The first pixel area PXA-R, the second pixel area PXA-G, and the third pixel area PXA-B may provide light having different colors from each other to the display surface DP-IS of FIG. 1A. In an embodiment, for example, the first pixel area PXA-R may provide red light to the display surface DP-IS, the second pixel area PXA-G may provide green light to the display surface DP-IS, and the third pixel area PXA-B may provide blue light to the display surface DP-IS.

A length of each of the first pixel areas PXA-R and the second pixel areas PXA-G in the first direction DR1 may be less than that of the third pixel area PXA-B in the first direction DR1. A length of each of the first pixel areas PXA-R and the second pixel areas PXA-G in the second direction DR2 may be greater than that of the third pixel area PXA-B in the second direction DR2. In an embodiment, methods for manufacturing light conversion patterns corresponding to the first pixel area PXA-R and the second pixel area PXA-R and an optical pattern corresponding to the third pixel area PXA-B are different from each other such that the first pixel area PXA-R, the second pixel area PXA-G, and the third pixel area PXA-B may have different lengths according to the directions thereof. This will be described later in greater detail with reference to FIGS. 5A to 5D.

Referring to FIG. 3B, the first display substrate 100 may include a first base substrate BS1, a circuit element layer DP-CL, a display element layer DP-OLED, and an upper insulating layer TFL. A laminated structure of the first display substrate 100 is not particularly limited.

Referring to FIG. 3B, a cross-section corresponding to a driving transistor T-D and a light emitting element OLED is illustrated as an example. A predetermined cell gap GP may be defined between the first display substrate 100 and the second display substrate 200. In an embodiment, the gap GP may be an empty space, but in an alternative embodiment of the invention, a predetermined material may be filled into the gap GP. In an embodiment, for example, a transparent insulating material may be filled into the gap GP.

Referring to FIG. 3B, the first display substrate 100 may include a plurality of insulation layers, a semiconductor pattern, a conductive pattern, a signal line, and the like. An insulating layer, a semiconductor layer, and a conductive layer are provided through coating, vapor deposition, or the like. Thereafter, the insulating layer, the semiconductor layer, and the conductive layer may be selectively patterned in a photolithography manner. The semiconductor pattern, the conductive pattern, and the signal line, which are provided in the circuit element layer DP-CL and the display element layer DP-OLED, may be formed in the above-described manner.

The first base substrate BS1 may include a plastic substrate or a glass substrate. In an embodiment, the circuit element layer DP-CL may include a buffer layer BFL, a first insulating layer 10, a second insulating layer 20, and a third insulating layer 30. In an embodiment, for example, each of the first insulating layer 10 and the second insulating layer 20 may be an inorganic layer, and the third insulating layer 30 may be an organic layer.

FIG. 3B illustrates an arrangement relationship of an active A-D, a source S-D, a drain S-D, and a gate G-D, which constitute the driving transistor T-D in an embodiment. The active A-D, the source S-D, the drain D-D may be areas that are divided according to a doping concentration or conductivity of the semiconductor pattern.

The display element layer DP-OLED includes a light emitting diode OLED. The light emitting element OLED may generate source light. The light emitting element OLED includes a first electrode, a second electrode, and a light emitting layer disposed between the first and second electrodes. In an embodiment, the display element layer DP-OLED may include an organic light emitting diode as the light emitting diode. The display element layer DP-OLED includes a pixel defining layer PDL. In an embodiment, for example, the pixel defining layer PDL may be an organic layer.

A first electrode AE is disposed on the third insulating layer 30. The first electrode AE is directly or indirectly connected to the driving transistor T-D, and a connection structure between the first electrode AE and the driving transistor T-D is not illustrated in FIG. 3B. An emission opening OP is defined in a pixel defining layer PDL. The emission opening OP of the pixel defining layer PDL exposes at least a portion of the first electrode AE. The light emitting opening OP defines an emission area LA corresponding to the first pixel area PXA-R in the first display substrate 100. Here, the "corresponding" means overlapping and is not limited as having a same area. The first display substrate 100 has emission areas LA and non-emission areas NLA, which correspond to the pixel areas PXA-R, PXA-G, and PXA-B and the peripheral area NPXA illustrated in FIG. 3A, respectively.

A hole control layer HCL, a light emitting layer EML, and an electron control layer ECL may be commonly disposed on the first pixel area PXA-R and the peripheral area NPXA. The hole control layer HCL, the light emitting layer EML, and the electron control layer ECL may be commonly disposed on the first to third pixel areas PXA-R, PXA-G, and PXA-B (see FIG. 3A).

The hole control layer HCL may include a hole transport layer and may further include a hole injection layer. The light emitting layer EML may generate blue light. The blue light may include a wavelength of about 410 nm to about 480 nm. An emission spectrum of the blue light may have a peak within a wavelength of about 440 nm to about 460 nm. The electron control layer ECL may include an electron transport layer and may further include an electron injection layer. The light emitting layer EML may be commonly disposed on the first to third pixel areas PXA-G, PXA-R, and PXA-B or may be independently disposed. The independent disposition means that the light emitting layer EML is separated for each of the first to third pixel areas PXA-R, PXA-G, and PXA-B. The second electrode CE is disposed on the electron control layer ECL. The second electrode CE may be commonly disposed on the first to third pixel areas PXA-R, PXA-G, and PXA-B.

An upper insulation layer TFL for protecting the second electrode CE may be disposed on the second electrode CE. The upper insulating layer TFL may include an organic material or an inorganic material. The upper insulating layer TFL may have a multilayered structure in which the inorganic layer/the organic layer are repeatedly disposed one on another. The upper insulating layer TFL may have a sealing structure of the inorganic layer/the organic layer/the inorganic layer. The upper insulating layer TFL may further include a refractive index control layer for improving emission efficiency.

The first display substrate 100 may include first, second, and third display elements respectively corresponding to the first to third pixel areas PXA-R, PXA-G, and PXA-B illustrated in FIG. 3A. The first, second, and third display elements may have the same laminated structure as each other and also may have the same laminated structure as the light emitting element OLED of FIG. 3B.

In an embodiment where the display panel is the liquid crystal display, each of the first, second, and third display elements may include two electrodes capable of generating electric fields and a liquid crystal layer of which an arrangement is deformable by the electric fields. The first, second, and third display elements may selectively provide source light provided from a backlight by respective operations. In one embodiment of the invention, each of the first, second, and third display elements may include a light emitting element in which an emission layer includes a quantum dot and/or a quantum rod.

As illustrated in FIG. 3B, the second display substrate 200 includes a second base substrate BS2, a division pattern BM disposed on a bottom surface BS2-LS of the second base substrate BS2, a light conversion pattern CCF-R disposed below the color filter CF-R, and a division partition wall BW. The division partition wall BW may be defined (or referred to) as another division pattern, and when one of the division partition wall BW and the division pattern BM is defined as a first division pattern, the other of the division partition wall BW and the division pattern BM may be defined as a second division pattern.

Also, the second display substrate 200 may further include a plurality of insulating layers 200-1, 200-2, and 200-3. Each of the plurality of insulating layers 200-1, 200-2, and 200-3 may be an organic layer or an inorganic layer.

The second base substrate BS2 may include a plastic substrate or a glass substrate. The division pattern BM overlapping the peripheral area NPXA is disposed on the bottom surface BS2-LS of the second base substrate BS2.

In an embodiment, the division pattern BM may have a multi-layered structure. The first layer BM-1 may include the same material as a color filter that transmits the blue light. The second layer BM-2 may include a common black coloring agent. The second layer BM-2 may include a black dye or a black pigment, which is mixed with a base resin. In one embodiment, the black component may include carbon black or may include a metal such as chromium or an oxide thereof. The second layer BM-2 may be, for example, a black matrix.

An opening BM1-OP corresponding to the first pixel area PXA-R may be defined in the division pattern BM. In an embodiment, the opening BM1-OP of the first layer BM-1 is defined to be the same as (or corresponding to) that of the first pixel area PXA-R. In an embodiment of the invention, the first layer BM-1 and the second layer BM-2 may have the same width as each other, and either one of the first layer BM-1 and the second layer BM-2 may be omitted.

The color filter CF-R transmits light in a specific wavelength range and blocks light in a range except for the corresponding specific wavelength range. The color filter CF-R includes a base resin and a dye and/or pigment dispersed in the base resin. The base resin may be a medium in which the dye and/or pigment are dispersed. In general, the base resin may include various resin compositions that are called as binders.

The light conversion pattern CCF-R may change optical properties of the source light. In an embodiment, the light conversion pattern CCF-R may generate light having a different color after absorbing the source light generated by the light emitting element OLED.

The light conversion layer may include a base resin and quantum dots mixed (dispersed) in the base resin. In an embodiment, the light conversion pattern may be defined as a quantum dot pattern and include quantum dots different from each other. The base resin may be a medium in which the quantum dots are dispersed. In general, the base resin may include various resin compositions that are called binders. However, the embodiment of the invention is not limited thereto. In this specification, a medium capable of dispersing the quantum dots may be called as the base resin regardless of its name, additional other functions, constituent materials, and the like. The base resin may be a polymer resin. In an embodiment, for example, the base resin may include at least one selected from an acrylic-based resin, a urethane-based resin, and a silicon-based resin, and an epoxy-based resin. The base resin may be a transparent resin.

The light conversion pattern may further include scattering particles mixed with the base resin. The scattering particles may be titanium oxide ($TiO_2$) or silica-based nanoparticles.

The quantum dots may be particles that convert a wavelength of incident light. Each of the quantum dots may be a material having a crystal structure having a size of several nanometers. The quantum dot may be composed of hundreds to thousands of atoms to provide a quantum confinement effect in which an energy band gas increases due to the small size. When light having a wavelength with energy greater than that of the band gap is incident into the quantum dots, the quantum dots may absorb the light and thus be in an excited state to emit light having a specific wavelength, thereby becoming a ground state. The emitted light has a value corresponding to a band gap. When the quantum dots are adjusted in size and composition, light emitting characteristics due to the quantum confinement effect may be adjusted.

The quantum dots may be selected from Group II-VI compounds, Group I-III-VI compounds, Group III-V compounds, Group IV-VI compounds, Group IV elements, Group IV compounds, and a combination thereof.

The Group II-VI compounds may include binary element compounds selected from CdSe, CdTe, CdS, ZnS, ZnSe, ZnTe, ZnO, HgS, HgSe, HgTe, MgSe, MgS, and a combination thereof, ternary element compounds selected from AgInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and quaternary element compounds selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The group compounds may include ternary compounds selected from $AgInS_2$, $CuInS_2$, $AgGaS_2$, $CuGaS_2$ and mixtures thereof or quaternary compounds such as $AgInGaS_2$ and $CuInGaS_2$.

The Group III-V compounds may include binary element compounds selected from GaN, GaP, GaAs, GaSb, AlN, AlP, AlAs, AlSb, InN, InP, InAs, InSb, and a combination thereof, ternary element compounds selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a combination thereof, and quaternary element compounds selected form GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group III-V compounds may further include the Group II metal. In an embodiment, for example, InZnP or the like may be selected as the group III-II-V compounds.

The Group IV-VI compounds may include binary element compounds selected from SnS, SnSe, SnTe, PbS, PbSe, PbTe, and a combination thereof, ternary element compounds selected from SnSeS, SnSeTe, SnSTe, PbSeS, PbSeTe, PbSTe, SnPbS, SnPbSe, SnPbTe, and a combination thereof, and quaternary element compounds selected form SnPbSSe, SnPbSeTe, SnPbSTe, and a combination thereof. The Group IV elements may include Si, Ge, and a combination thereof. The Group IV compounds may be binary element compounds selected from SiC, SiGe, and a combination thereof.

Here, the binary element compounds, the ternary element compounds, and the quaternary element compounds may exist in the particle at a uniform concentration or exist in the particle in a state in which concentration distribution is partitioned into partially different states.

The quantum dots may have a core shell structure including a shell surrounding a core. Alternatively, the quantum dot may have a core/shell structure in which one quantum dot surrounds the other quantum dot. An interface between the core and the shell may have a concentration gradient in which an element existing in the shell has a concentration that gradually decreases toward the core.

Each of the quantum dots may have a particle having a size of a nano scale. The quantum dots may have a full width at half maximum (FWHM) of an emission wavelength spectrum of about 45 nm or less, preferably about 40 nm or less, more preferably about 30 nm or less. In this range, color purity and color reproducibility may be improved. Also, light emitted through the quantum dots may be emitted in all directions to improve an optical viewing angle.

Also, each of the quantum dots has a shape that is generally used in the art and is not specifically limited in shape. However, the quantum dot may have a spherical shape, a pyramidal shape, a multi-arm shape, a cubic nanoparticle shape, a nanotube shape, a nanowire shape, a nanofiber shape, a nanoplate particle shape, or the like. The quantum dot may adjust a color of emitted light according to a size thereof. Thus, the quantum dot may emit light having various colors such as a red color, a green color, and a blue color.

In an embodiment, the first light conversion pattern CCF-R disposed on the first pixel area PXA-R may be a red quantum dot pattern that generates the red light after absorbing the source light. A second light conversion pattern may be disposed to correspond to the second pixel area PXA-G of FIG. 3A. The second light conversion pattern may be a green quantum dot pattern that generates the green light after absorbing the source light.

The first insulating layer 200-1 is disposed below the color filter CF-R. The second insulating layer 200-2 for providing a flat surface may be disposed under the first insulating layer 200-1. The first insulating layer 200-1 may be an inorganic layer, and the second insulating layer 200-2 may be an organic layer. Although the same term is used in this specification, it is clear that the first to third insulating layers 200-1, 200-2, and 200-3 of the second display substrate 200 are distinguished from the first to third insulating layers 20, and 30 of the above-described circuit element layer DP-CL.

The division partition wall BW is disposed below the second insulating layer 200-2. In an embodiment, the division partition wall BW may include a base resin having high light transmittance and an additive. In general, the base resin may include various resin compositions that are called binders. The additive may include a coupling agent and/or a photoinitiator. The additive may further include a dispersant.

The division partition wall BW may be divided into two areas having different properties from each other in cross section. The division partition wall BW may include a first hydrophilic region BW-1 (hereinafter, referred to as a hydrophilic region) and a second hydrophobic region BW-2 (hereinafter, referred to as a hydrophobic region) extending from the hydrophilic region BW-1. An opening BW-OP is defined in the division partition wall BW. The first light conversion pattern CCF-R is disposed inside the opening BW-OP. The third insulating layer 200-3 may be an inorganic layer that seals the division partition wall BW and the first light conversion pattern CCF-R.

Figure 4:
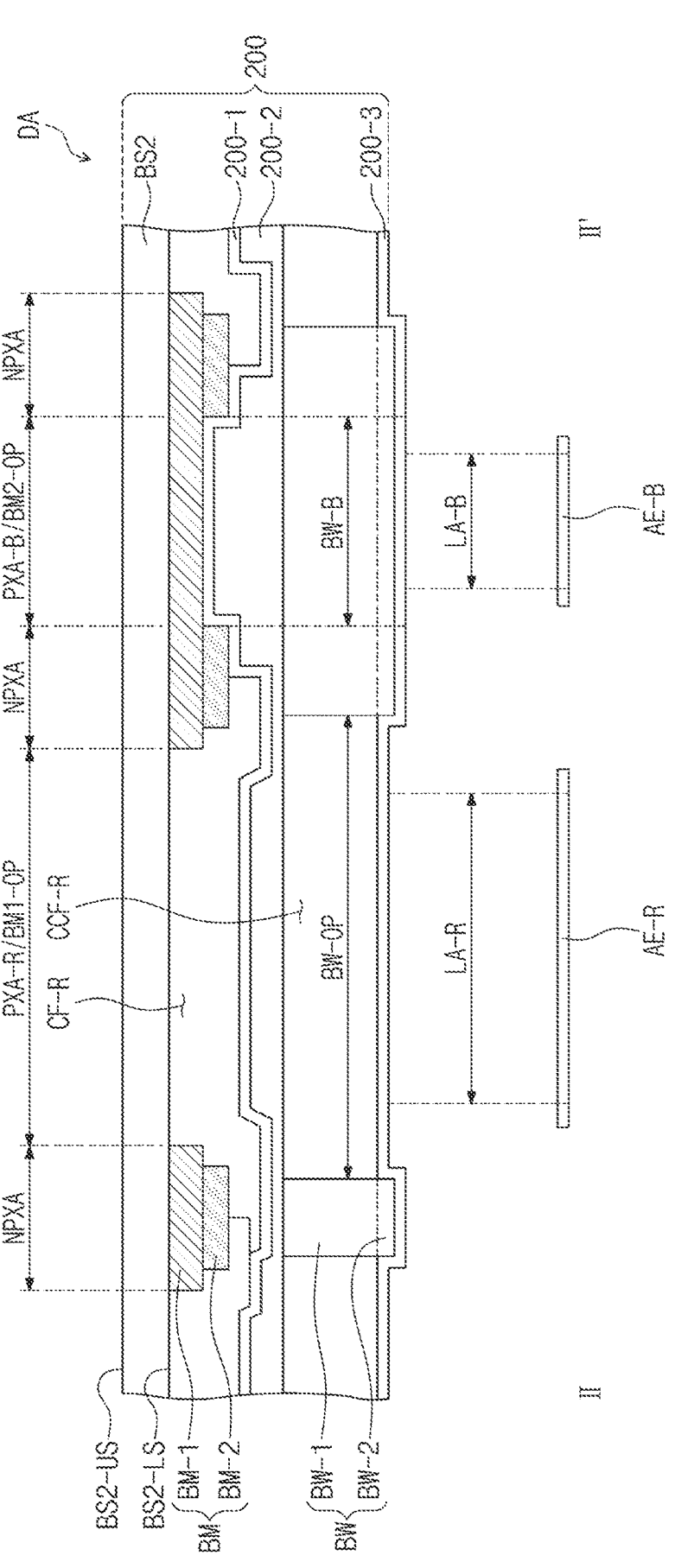
FIG. 4 is a cross-sectional view of a second display substrate, taken along line II-II' of FIG. 3A, according to an embodiment of the invention.

FIG. 4 is a cross-sectional view of the second display substrate 200, taken along line II-II' of FIG. 3A, according to an embodiment of the invention. FIGS. 5A to 5D are views illustrating a method for manufacturing the second display substrate 200 according to an embodiment of the invention. Hereinafter, any repetitive detailed descriptions with respect to the same elements in FIG. 4 as those described above with reference to FIGS. 1 to 3B will be omitted.

Referring to FIG. 4, for convenience of illustration, the first display substrate 100 is not shown, and a first electrode AE-R corresponding to the first pixel area PXA-R and a first electrode AE-B and a third emission area LA-B, which respectively correspond to a first emission area LA-R and the third pixel area PXA-R, are schematically illustrated. Any repetitive detailed description of the first display substrate 100 corresponding to the first pixel area PXA-R and the third pixel area PXA-B of FIG. 4, which are the same as those described above with reference to FIG. 3B, will be omitted.

In an embodiment, the first layer BM-1 of the division pattern BM may include the same material as the color filter that transmits the blue light and may overlap the third pixel area PXA-B. In such an embodiment, a portion of the first layer BM-1 overlapping the third pixel area PXA-B may serve as a color filter of the third pixel area PXA-B. A portion of the first layer BM-1 overlapping the third pixel area PXA-B may transmit the source light. Substantially, an opening BM2-OP of the second layer BM-2 may define the third pixel area PXA-B.

The division partition wall BW may overlap not only the peripheral area NPXA but also the third pixel area PXA-B. A portion of the division partition wall BW overlapping the third pixel area PXA-B may be defined as a light transmitting portion BW-B that transmits the source light without any wavelength conversion thereto.

The division partition wall BW may further include the scattering particles mixed with the base resin. The scattering particles may be titanium oxide ($TiO_2$) or silica-based nanoparticles. The scattering particles scatter the source light that is incident to the light transmitting portion BW-B. The scattered light may expand a viewing angle.

Figure 5A:
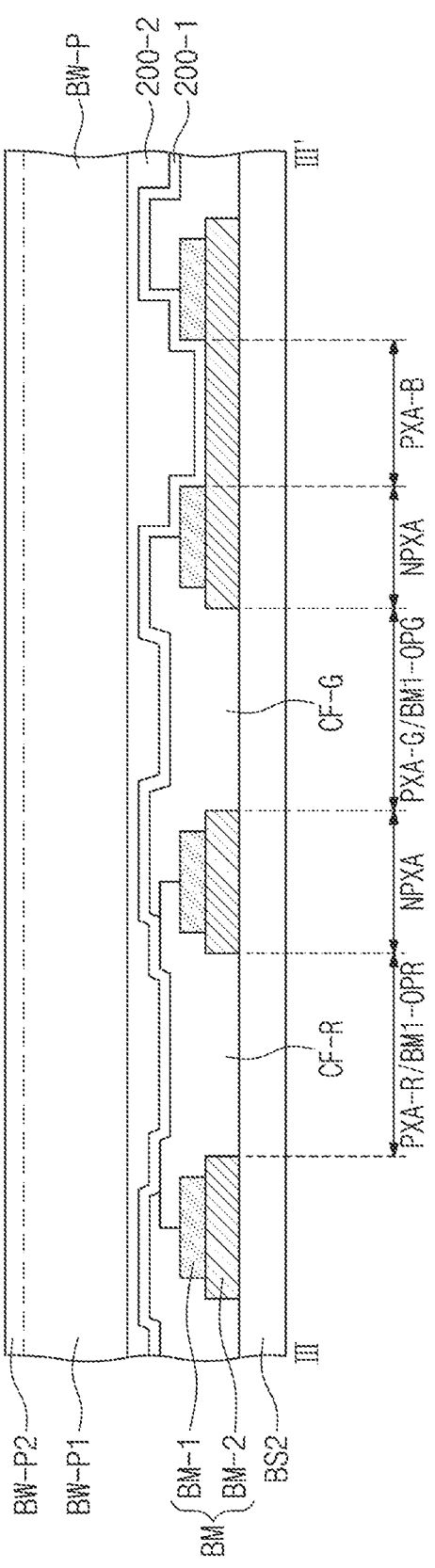
Figure 5B:
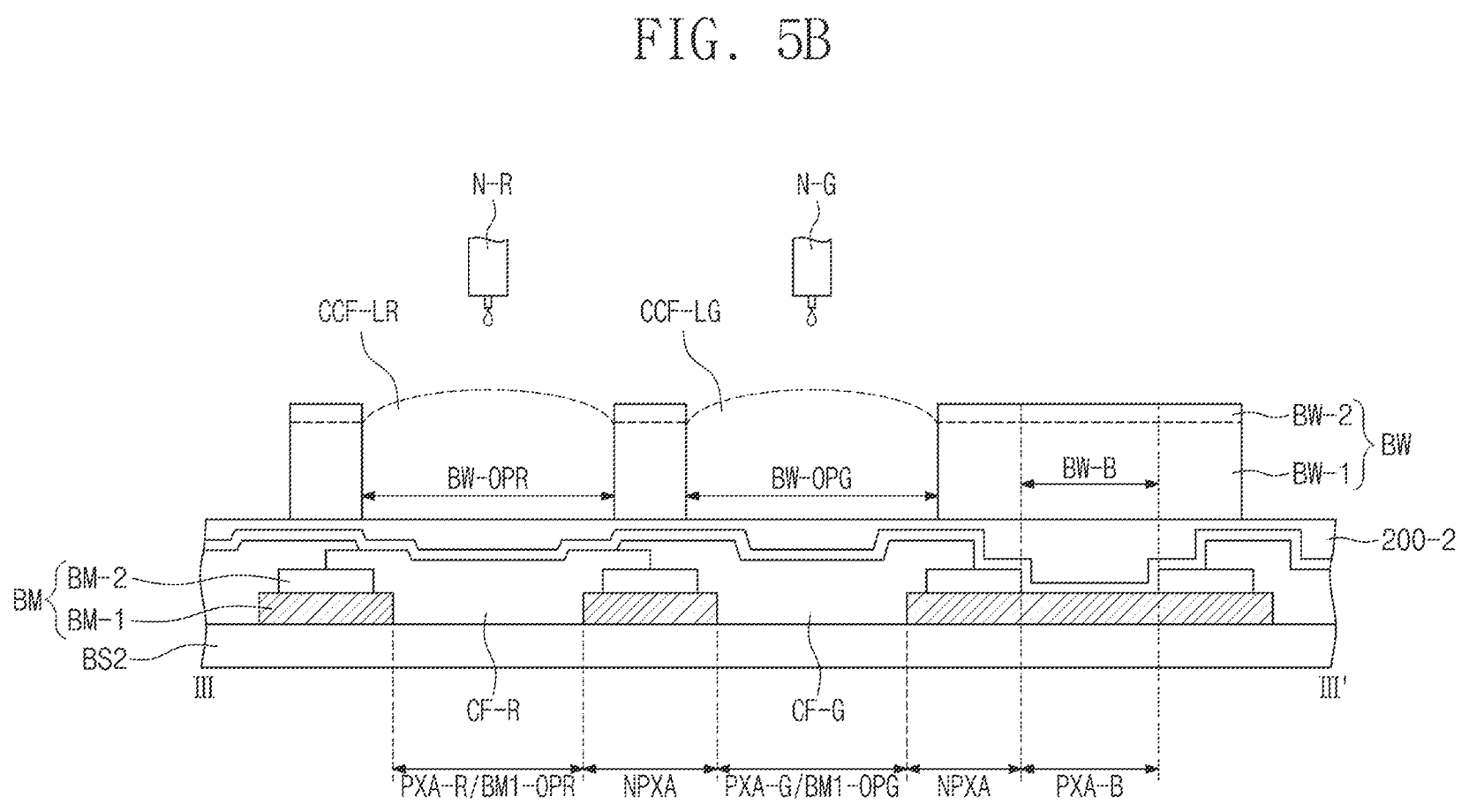
Figure 5C:
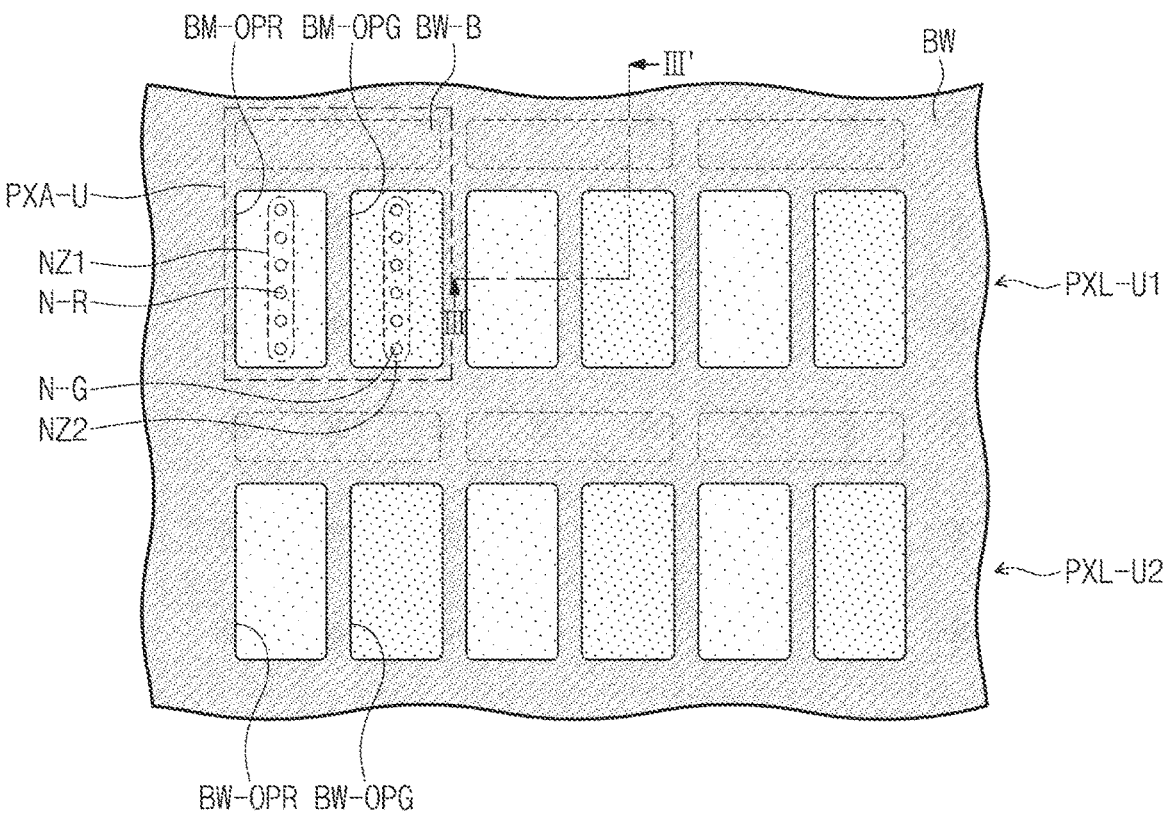
Figure 5C:
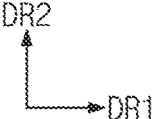
Figure 5D:
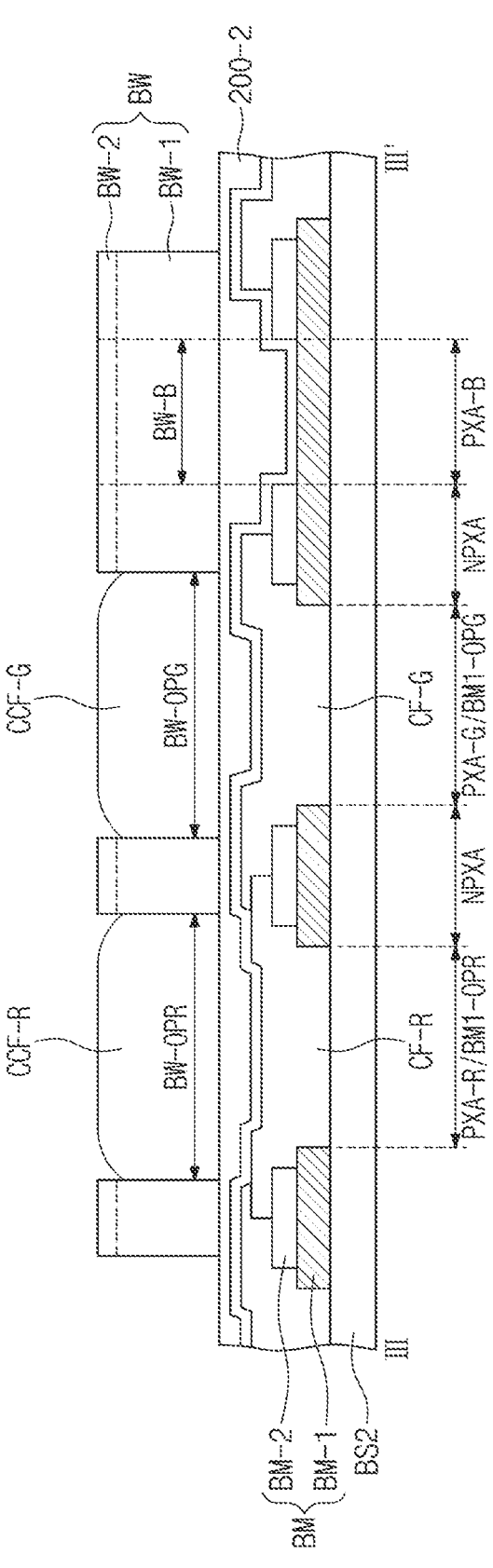

FIGS. 5A to 5D illustrate a method for manufacturing the first display substrate 100 according to an embodiment of the invention. FIGS. 5A, 5B and 5D correspond to a cross-section taken along line III-III' of FIG. 5C. Hereinafter, any repetitive detailed descriptions with respect to the same elements of FIGS. 5A to 5D as those described above with reference to FIGS. 1 to 4 will be omitted.

Referring to FIG. 5A, a division pattern BM is formed (or provided) on one surface of the base substrate BS2. One surface of the base substrate BS2 corresponds to a bottom surface BS2-LS of the second base substrate BS2 of FIG. 4. The first layer BM-1 and the second layer BM-2 of the division pattern BM may be sequentially formed using a photolithography process. A first opening BM1-OPR and a second opening BM1-OPG respectively corresponding to the first pixel region PXA-R and the second pixel region PXA-G are formed. In an embodiment, the first layer BM-1 and the second layer BM-2 may be formed at the same time or during a same process.

Thereafter, color filters CF-R and CF-G are provided. A first color filter CF-R is provided to overlap the first pixel area PXA-R. A second color filter CF-G is provided to overlap the second pixel area PXA-G. The first color filter CF-R and the second color filter CF-G may be sequentially formed using (or by performing) the photolithography process.

In an embodiment, the first color filter CF-R may be a red color filter, and the second color filter CF-G may be a green color filter. In an alternative embodiment of the invention, a yellow color filter may be applied. In such an embodiment, the first color filter CF-R and the second color filter CF-G may be replaced by a single color filter that is not divided.

Thereafter, the first insulating layer 200-1 and the second insulating layer 200-2 are sequentially formed. In an embodiment, the second insulating layer 200-2 may be a base layer for forming a division partition wall to be described later. The base layer may be an organic layer that provides a flat surface.

A preliminary division partition wall layer BW-P is formed on the second insulating layer 200-2. The preliminary division partition wall layer BW-P may include a hydrophobic agent that is chemically bonded to the base resin. The hydrophobic agent is phase-separated and densely arranged on a top surface of the preliminary division partition wall layer BW-P to define a hydrophobic region BW-P2. The remaining region has relatively strong hydrophilicity and thus is defined as a hydrophilic region BW-P1. The hydrophobic agent may include a fluorinated epoxy-based material and a perfluorinated ether-based material.

As illustrated in FIG. 5B, the preliminary division partition wall layer BW-P is patterned using a photolithography process. As a result, a division partition wall BW is formed. A first opening BW-OPR and a second opening BW-OPG that respectively correspond to the first pixel area PXA-R and the second pixel area PXA-G are formed in the division partition wall BW. In addition, the division partition wall BW includes a light transmitting portion BW-B overlapping the third pixel area PXA-B.

A liquid quantum dot composition CCF-LR (hereinafter, referred to as a first composition) is provided inside the first opening BW-OPR, and another liquid quantum dot composition CCF-LG (hereinafter, referred to as a second composition) is provided inside the second opening BW-OPG. The first composition CCF-LR includes, for example, red quantum dots, and the second composition CCF-LG includes, for example, green quantum dots. The hydrophobic region BW-2 may prevent the first composition CCF-LR from overflowing into the second opening BW-OPG.

Referring to FIGS. 5B and 5C, the first composition CCF-LR and the second composition CCF-LG may be provided using an inkjet process. An inkjet head may include a first nozzle group NZ1 and a second nozzle group NZ2. The first nozzle group NZ1 includes a plurality of nozzles N-R for providing the first composition CCF-LR. The second nozzle group NZ2 includes a plurality of nozzles N-G for providing the second composition CCF-LG.

As illustrated in FIG. 5C, the first nozzle group NZ1 and the second nozzle group NZ2 may provide the first composition CCF-LR and the second composition CCF-LG to unit areas PXA-U, respectively. The inkjet head may provide the first composition CCF-LR and the second composition CCF-LG while moving in the first direction DR1. In an embodiment, each of the first opening BW-OPR and the second opening BW-OPG has to have a width equal to or greater than a predetermined length to prevent the first composition CCF-LR and the second composition CCF-LG from being mixed with each other. The width is a length in the first direction DR1. According to an embodiment, as described with reference to FIG. 3A, since the third pixel area PXA-B is disposed within the second direction DR2 from the first pixel area PXA-R and the second pixel area PXA-G, a width of each of the first opening BW-OPR and the second opening BW-OPG may be expanded compared to a structure in which the third pixel area PXA-B is disposed within the first direction DR1.

In an embodiment, a ratio of a length in the first direction DR1 to a length in the second direction DR2 of each of the first opening BW-OPR and the second opening BW-OPG is in a range of about 1:1 to about 1:3. In an embodiment, for example, the ratio of the length in the first direction DR1 to the length in the second direction DR2 of each of the first opening BW-OPR and the second opening BW-OPG may be in a range of about 1:1.5 to about 1:2.25.

As illustrated in FIG. 5D, the first composition CCF-LR and the second composition CCF-LG are dried. As a result, a first light conversion pattern CCF-R and a second light conversion pattern CCF-G are formed. Although not shown separately, a third insulating layer 200-3 (see FIG. 3b) covering the first light conversion pattern CCF-R, the second light conversion pattern CCF-G, and the division partition wall BW may be further formed.

Referring to FIGS. 5C and 5D, since the first light conversion pattern CCF-R and the second light conversion pattern CCF-G are formed through a process different from that for forming the light transmitting portion BW-B, the first light conversion pattern CCF-R and the second light conversion pattern CCF-G may have different structural characteristics. Hereinafter, the first light conversion pattern CCF-R will be mainly described.

A thickness of the first light conversion pattern CCF-R may be less than that of the light transmitting portion BW-B overlapping the third pixel area PXA-B. This is because, after the first composition CCF-LR is provided to the extent not to overflow the first opening BW-OPR, the thickness of the first composition CCF-LR is reduced by the drying.

Since the light transmitting portion BW-B is formed by a photolithography process, the light transmitting portion BW-B has a flat top surface. In contrast, the first light conversion pattern CCF-R provides a relatively curved top surface because the drying process is performed after providing the liquid composition. That is, the top surface of the light transmitting portion BW-B is flatter (or has a higher flatness) than the top surface of the first light conversion pattern CCF-R.

In addition, the light transmitting portion BW-B is formed to correspond to the plurality of third pixel areas PXA-B through a same process of the photolithography process. Thus, a thickness deviation of the plurality of light transmitting portions BW-B is small. The plurality of first light conversion patterns CCF-R are formed by providing the liquid composition to each of the plurality of first pixel areas PXA-R. Since the liquid composition is provided discontinuously, a weight deviation of the provided liquid composition may occur. Thus, a thickness deviation of the plurality of first light conversion patterns CCF-R may be relatively large.

Figure 6:
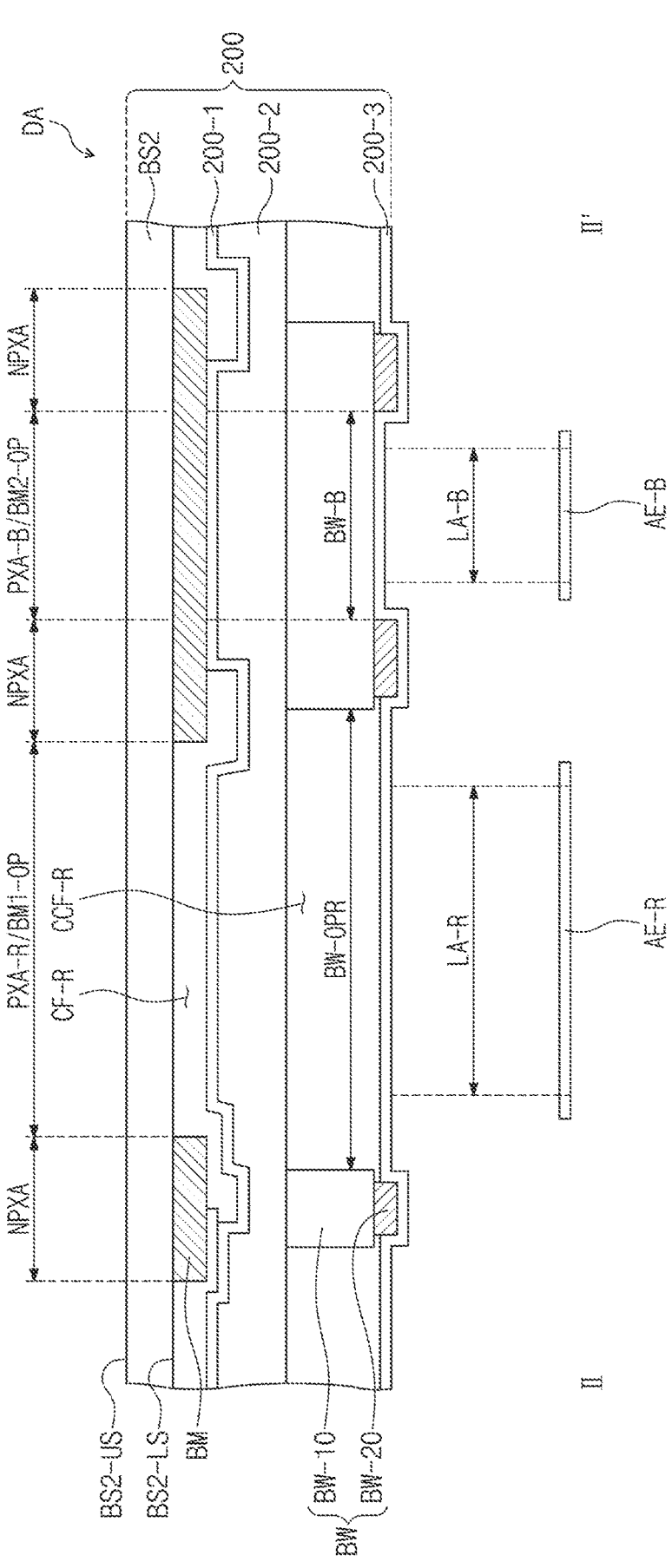
FIG. 6 is a cross-sectional view of the second display substrate, taken along line II-II' of FIG. 3A, according to an alternative embodiment of the invention.

FIG. 6 is a cross-sectional view of the second display substrate 200, taken along line II-II' of FIG. 3A, according to an alternative embodiment of the invention. Hereinafter, any repetitive detailed descriptions with respect to the same elements of FIG. 6 as those described above with reference to FIGS. 1 to 5D will be omitted.

Referring to FIG. 6, the division pattern BM may include only a portion corresponding to the first layer BM-1 of FIG. 4. The division partition wall BW may include a first layer BW-10 having hydrophilicity and a second layer BW-20 having hydrophobicity. Even if the same name is used in this specification, it is clear that the first layer BW-10 and the second layer BW-20 of the division partition wall BW are distinguished from the first layer BM-1 and the second layer BM-2 of the above-described division pattern BM.

The first layer BW-10 includes a light transmitting portion BW-B. The first layer BW-10 includes a base resin having high light transmittance. In general, the base resin may include various resin compositions that are called as binders. The second layer BW-20 may further include a hydrophobic component compared to the first layer BW-10. The second layer BW-20 may further include a black component compared to the first layer BW-10. The black component may include a black dye, a black pigment, or carbon black or may include a metal such as chromium or an oxide thereof. The second layer BW-20 may replace the second layer BM-2 of the division pattern BM of FIG. 4 to define the third pixel area PXA-B. The second layer BW-20 may further include both the hydrophobic component and the black component.

In an embodiment of the invention, the first layer BW-10 may further include scattering particles. In an alternative embodiment of the invention, the division pattern BM may have a two-layered structure like the division pattern BM illustrated in FIG. 4.

Figure 7:
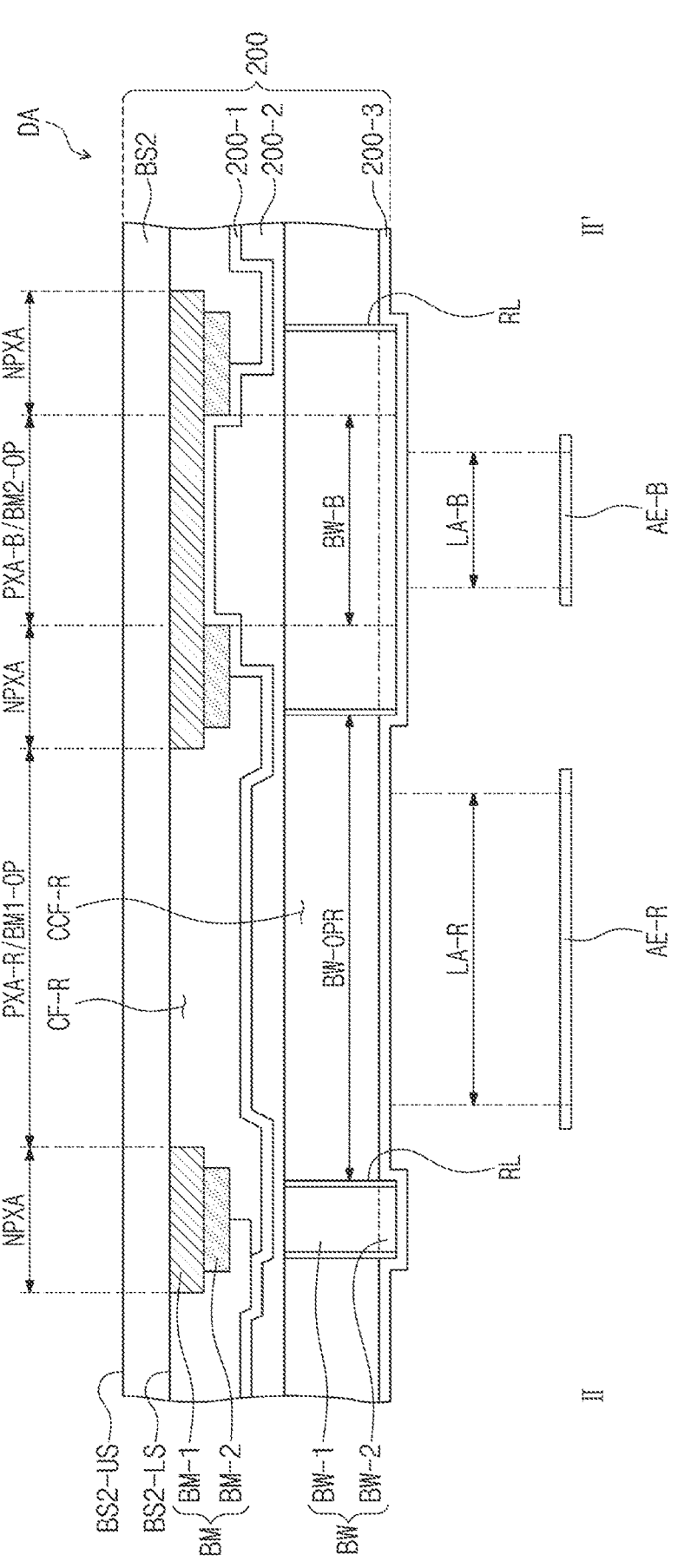
FIG. 7 is a cross-sectional view of the second display substrate, taken along line II-II' of FIG. 3A, according to another alternative embodiment of the invention.
Figure 8A:
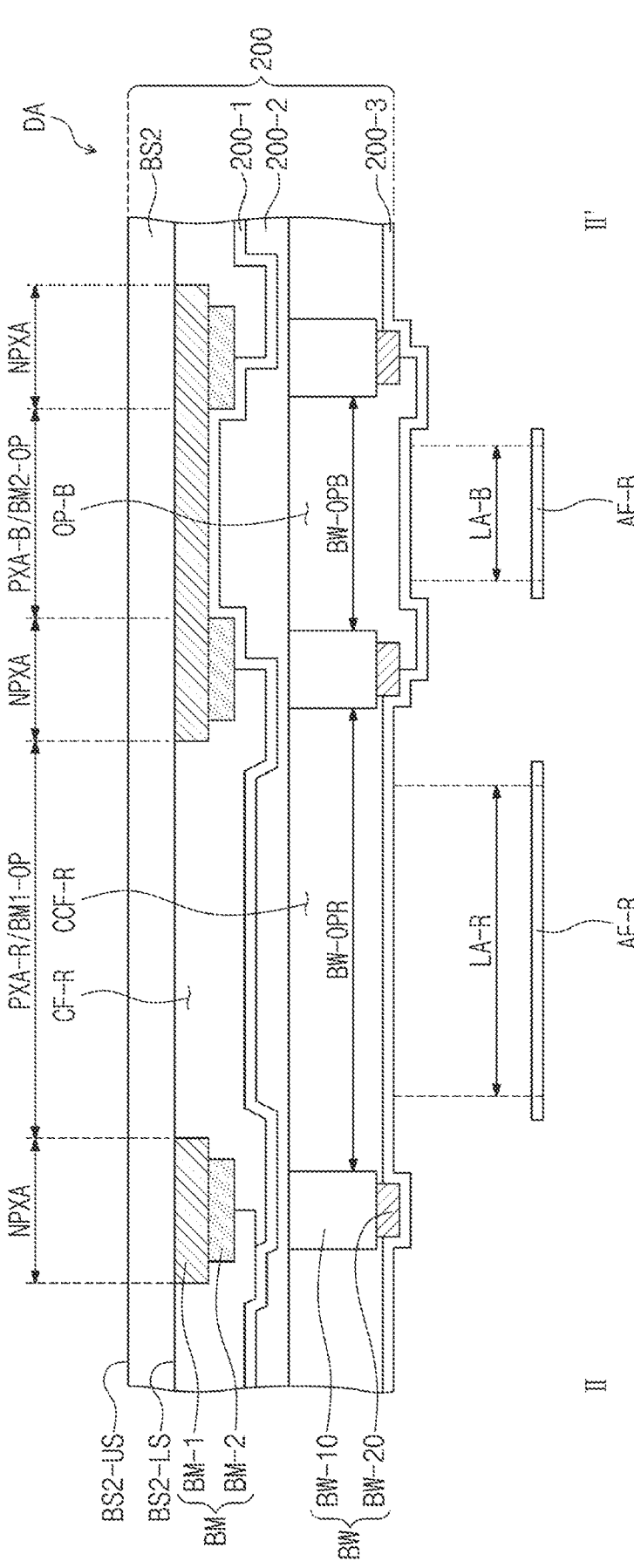
FIGS. 8A to 8C are cross-sectional views of the second display substrate, taken along line II-II' of FIG. 3A, according to another alternative embodiment of the invention.
Figure 8B:
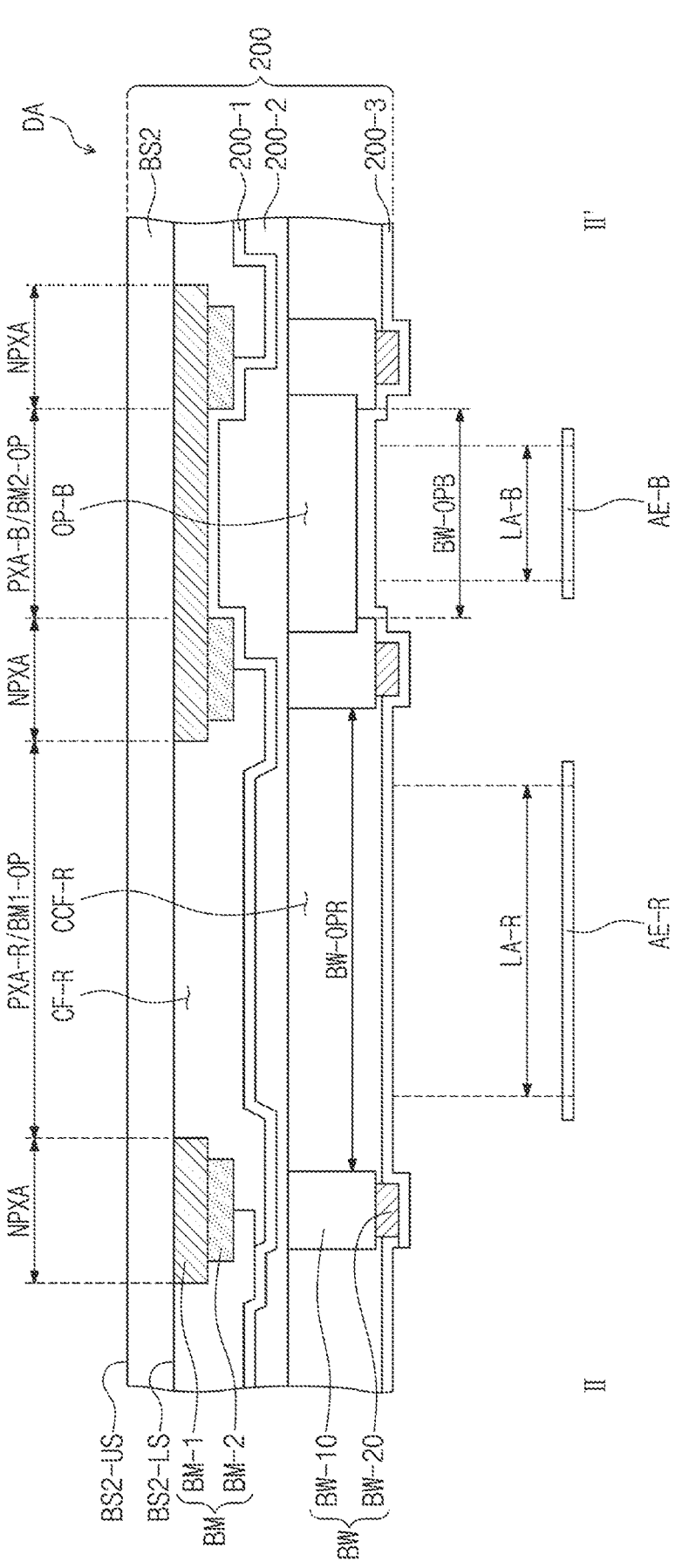
Figure 8C:
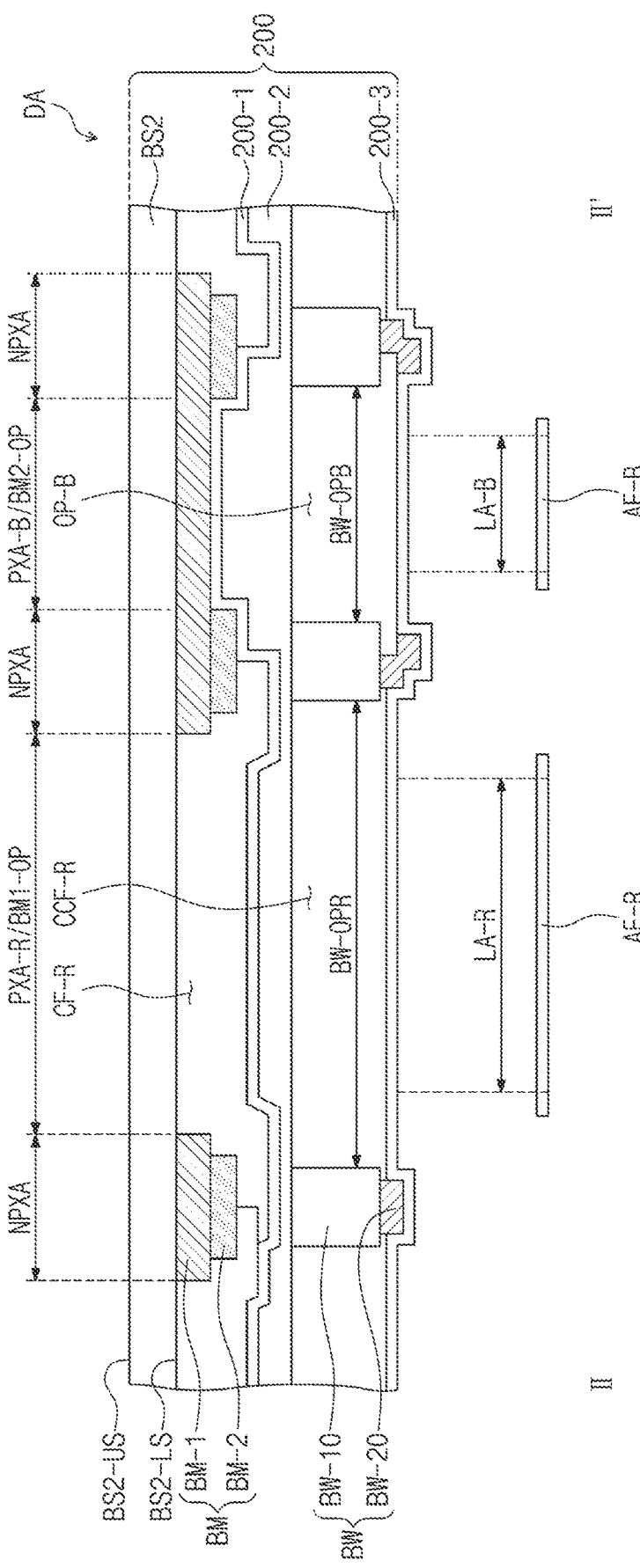

FIG. 7 is a cross-sectional view of the second display substrate 200, taken along line II-II' of FIG. 3A, according to another alternative embodiment of the invention. FIGS. 8A to 8C are cross-sectional views of the second display substrate 200, taken along line II-II' of FIG. 3A, according to another alternative embodiment of the invention. Hereinafter, any repetitive detailed descriptions with respect to the same elements of FIGS. 7 to 8C as those described above with reference to FIGS. 1 to 5D will be omitted.

Referring to FIG. 7, in an alternative embodiment, a reflective layer RL disposed on an inner wall surface of the division partition wall BW may be further provided. The reflective layer RL may reflect light converted in the light conversion pattern to improve light output efficiency.

Referring to FIG. 8A, in another alternative embodiment, a third opening BW-OPB corresponding to the third pixel area PXA-B is defined in the division partition wall BW. The light transmitting portion BW-B corresponding to a portion of the division partition wall BW is replaced with an optical pattern OP-B provided by a separate process.

The manufacturing method of the second display substrate 200 according to such embodiments will be described with reference to different processes from those of the manufacturing method illustrated in FIG. 5B as follows. In the photolithography process in which the first opening BM-OPR and the second opening BM-OPG are defined, the third opening BW-OPB corresponding to the third pixel area PXA-B is further defined. Thereafter, the optical pattern OP-B is defined to correspond to the third opening BW-OPB through an additional lamination process and a photolithography process. As a result, the optical pattern OP-B may include an organic material pattern.

Since the optical pattern OP-B is formed after forming the division partition wall BW, a portion of the optical pattern OP-B overlaps the division partition wall BW. In addition, a stepped portion is provided on the optical pattern OP-B.

In such an embodiment, at least one of the optical pattern OP-B or the first layer BM-1 of the division pattern BM may further include scattering particles. The scattering particles may scatter the source light. The scattered light may increase a viewing angle.

In such an embodiment, the first layer BW-10 and the second layer BW-20 of the division partition wall BW may include the same material or different materials. Each of the first layer BW-10 and the second layer BW-20 may include the black component. The second layer BW-20 may further include a hydrophobic component compared to the first layer BW-10.

In such an embodiment, the division partition wall BW having the two-layered structure is illustrated as an example, but the invention is not limited thereto. In an alternative embodiment, the first layer BW-10 and the second layer BW-20 may have substantially the same thickness as each other.

In an embodiment of the invention, where both the first layer BW-10 and the second layer BW-20 of FIG. 8A do not include the black component, at least one of the first layer BW-10 and the second layer BW-20 may further include scattering particles mixed with the base resin. In an embodiment of the invention, where both the first layer BW-10 and the second layer BW-20 of FIG. 8A do not include the black component, the reflective layer RL described in FIG. 7 may be further disposed on the second display substrate 200.

A method for manufacturing the second display substrate 200 illustrated in FIG. 8B will be described with reference to different processes from those of the method for manufacturing the second display substrate 200 illustrated in FIG. 8A as follows. Before forming the division partition wall BW, the optical pattern OP-B is formed. A portion of the first layer BW-10 may overlap the optical pattern OP-B. A process of forming the division partition wall BW of FIG. 8*b* may be the same as that of the division partition wall BW illustrated in FIG. 8*a*.

A method for manufacturing the second display substrate 200 illustrated in FIG. 8C will be described with reference to different processes from those of the method for manufacturing the second display substrate 200 illustrated in FIG. 8A as follows. After forming the first layer BW-10, the optical pattern OP-B is formed before forming the second layer BW-20. A portion of the optical pattern OP-B may overlap the first layer BW-10. Also, a stepped portion may be formed on the optical pattern OP-B.

The second display substrate 200 illustrated in FIGS. 8B and 8C may also be changed into various shapes as described with reference to the second display substrate 200 illustrated in FIG. 8A. However, for convenience of description, any repetitive detailed descriptions of the same or like features as those described above will be omitted.

Figure 9:
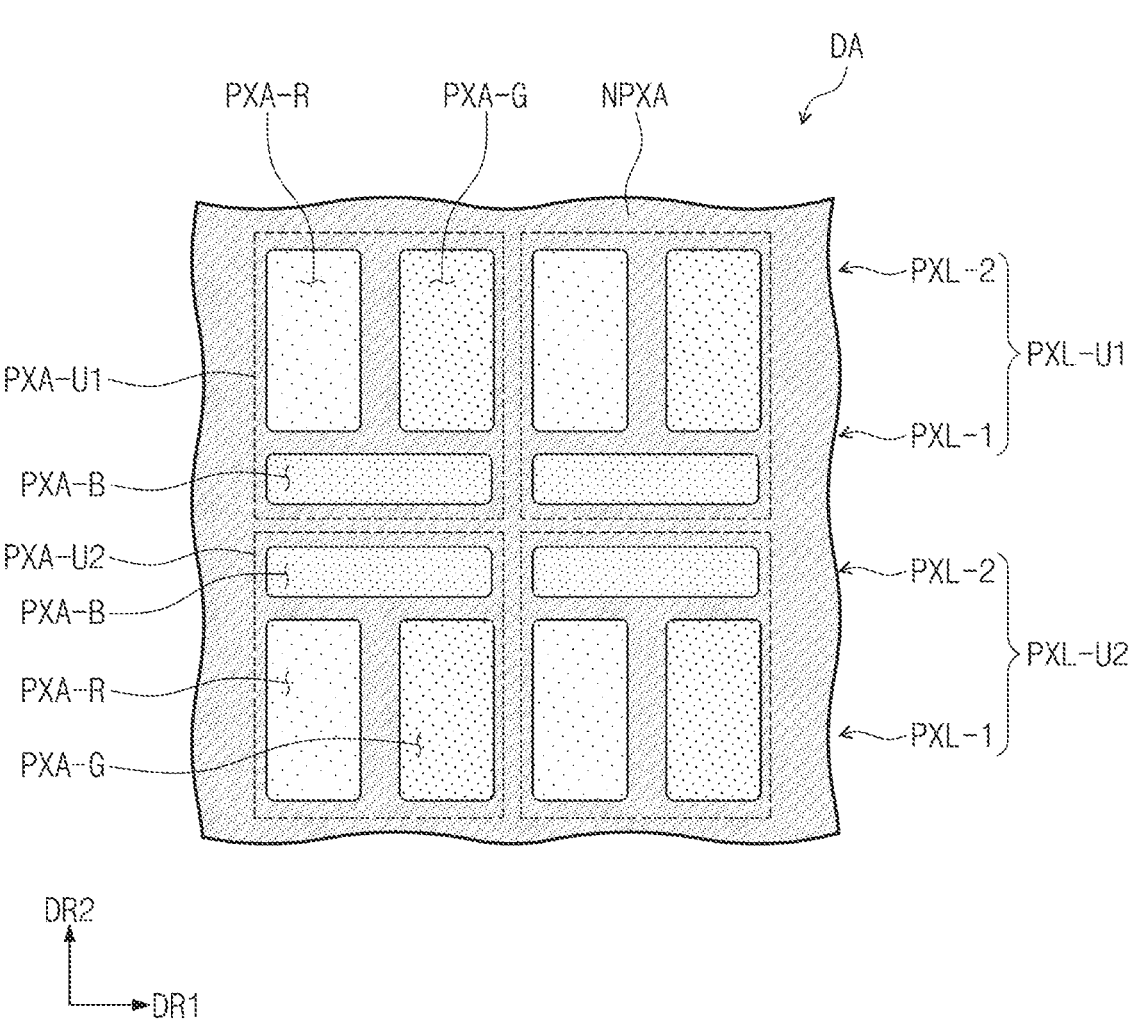
FIG. 9 is a plan view of a display area according to an alternative embodiment of the invention.

FIG. 9 is a plan view of a display area DA according to an alternative embodiment of the invention. Hereinafter, any repetitive detailed descriptions with respect to the same elements of FIG. 9 as those described above with reference to FIGS. 1 to 5D will be omitted.

Referring to FIG. 9, the display area DA includes two types of unit areas PXA-U1 and PXA-U2. A plurality of first unit areas PXA-U1 are arranged in the first direction DR1 to define a first unit pixel row PXL-U1. A plurality of second unit areas PXA-U2 are arranged in the first direction DR1 to define a second unit pixel row PXL-U2. The first unit pixel row PXL-U1 and the second unit pixel row PXL-U2 are two continuous unit pixel rows of n unit pixel rows. Where n is a natural number greater than or equal to 2. The first unit pixel rows PXL-U1 and the second unit pixel rows PXL-U2 may be alternately disposed along the second direction DR2.

An arrangement pattern of a first pixel area PXA-R, a second pixel area PXA-G, and a third pixel area PXA-B of the first unit area PXA-U1 may be symmetric with respect to an arrangement pattern of a first pixel area PXA-R, a second pixel area PXA-G, and a third pixel area PXA-B of the second unit area PXA-US based on a line in the first direction DR1.

The arrangement pattern of the first pixel area PXA-R, the second pixel area PXA-G, and the third pixel area PXA-B is not limited thereto. In one embodiment of the invention, positions of the first pixel area PXA-R and the second pixel area PXA-G of any one of the unit area PXA-U1 and the second unit area PXA-U2 illustrated in FIG. 9 may be interchanged with each other. In an embodiment of the invention, positions of the first pixel area PXA-R and the second pixel area PXA-G of any one of the unit area PXA-U of the first pixel row PXL-1 and the unit area PXA-U of the second pixel row PXL-2 illustrated in FIG. 3*a* may be interchanged with each other.

Figure 10A:
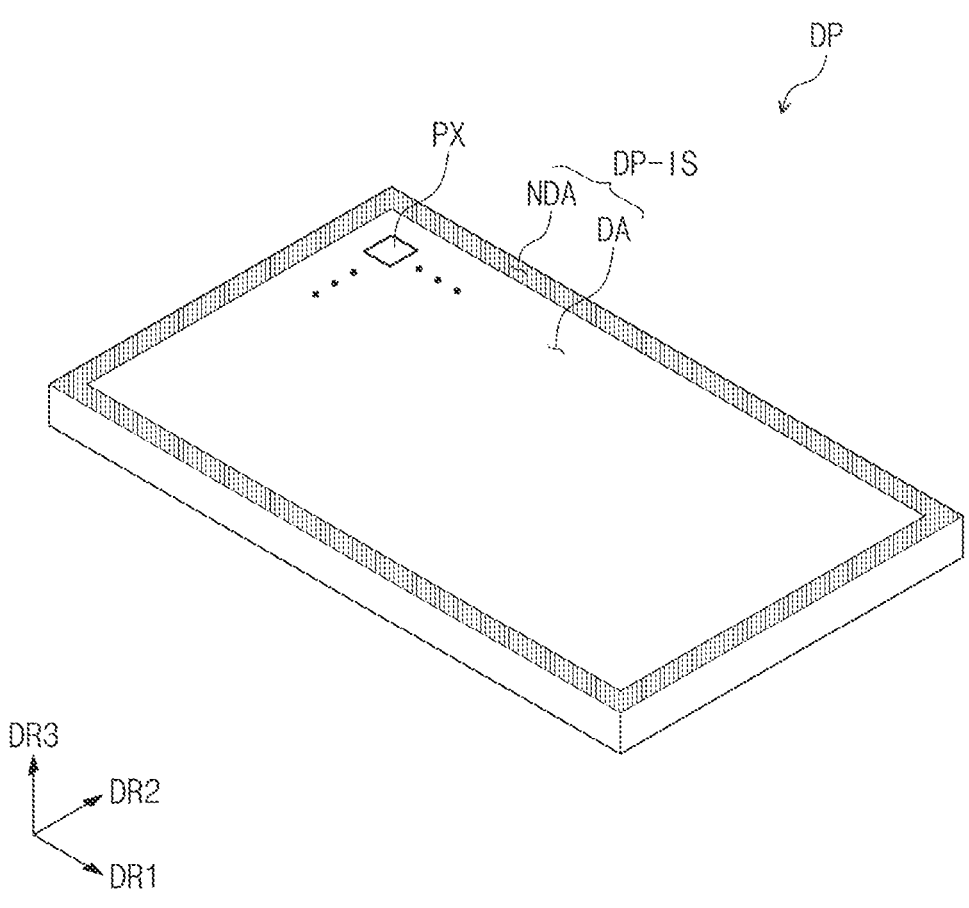
FIG. 10A is a perspective view of a display panel according to an alternative embodiment of the invention.
Figure 10B:
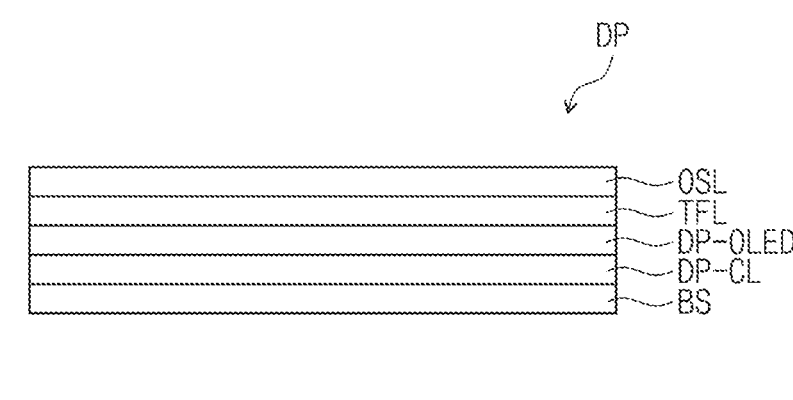
FIG. 10B is a schematic plan view of the display panel illustrated in FIG. 10A.
Figure 10C:
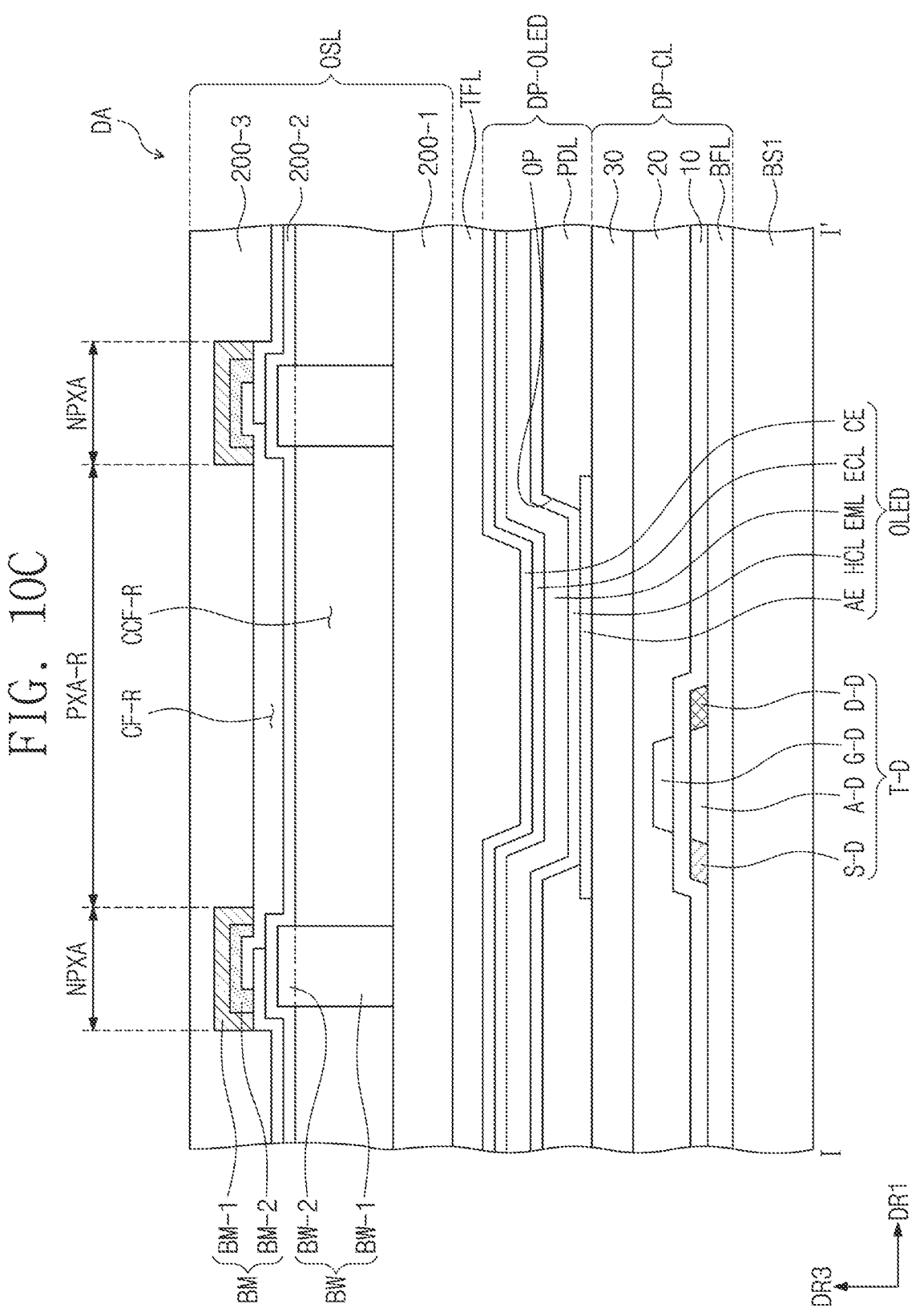
FIG. 10C is a cross-sectional view of a display area illustrated in FIG. 10A.

FIG. 10A is a perspective view of a display panel DP according to an alternative embodiment of the invention. FIG. 10B is a schematic plan view of the display panel DP illustrated in FIG. 10A. FIG. 10C is a cross-sectional view of a display area DA illustrated in FIG. 10A. FIGS. 11A to 11D are views illustrating a method for manufacturing a light conversion pattern illustrated in FIG. 10C. Hereinafter, any repetitive detailed descriptions with respect to the same elements of FIGS. 10A to 11D as those described above with reference to FIGS. 1 to 9 will be omitted.

In an embodiment, as described above with reference to FIGS. 1A to 9, the display panel DP may include two base substrates, i.e., the first base substrate BS1 and the second base substrates BS2. In an alternative embodiment, as shown in FIGS. 10A to 10C, the display panel DP includes a single base substrate BS. In such an embodiment, in the fabricating process, a process of coupling a first display substrate 100 to a second display substrate 200 is omitted, and structures are sequentially formed on the base substrate BS.

As illustrated in FIGS. 10A to 10C, the display panel DP includes a base substrate BS, a circuit element layer DP-CL disposed on the base substrate BS, a display element layer DP-OLED, and an upper insulating layer TFL. Thus, any repetitive detailed descriptions of the same elements of 10A to 10C as those described above will be omitted.

A light control layer OSL is disposed on the upper insulating layer TFL. The light control layer OSL corresponds to the second display substrate 200 described with reference to FIGS. 1 to 9. A difference between the second display substrate 200 and the light control layer OSL appears in a manufacturing process. Unlike the method, in which the second display substrate 200 is formed in a process separate from a process of forming the first display substrate 100, the light control layer OSL may be formed on the upper insulating layer TFL through a continuous process.

The light control layer OSL includes a division partition wall BW, a light conversion pattern CCF-R, a color filter CF-R, and a division pattern BM, which are disposed on the upper insulating layer TFL. In such an embodiment, in a cross-sectional structure and a planar arrangement relationship of the division partition wall BW, the light conversion pattern CCF-R, the color filter CF-R, and the division pattern BM in the light control layer OSL are substantially the same as or similar to those of the second display substrate 200 described above, which will be described later in greater detail together with the manufacturing method.

Also, the light control layer OSL may further include a plurality of insulating layers 200-1, 200-2, and 200-3. Each of the plurality of insulating layers 200-1, 200-2, and 200-3 may be an organic layer or an inorganic layer. The first insulating layer 200-1 may be a base layer that provides a flat top surface. The first insulating layer 200-1 may correspond to the second insulating layer 200-2 described above with reference to FIG. 5A. In an embodiment, the first insulating layer 200-1 may be omitted, and in such an embodiment, the upper insulating layer TFL may correspond to the base layer.

Figure 11A:
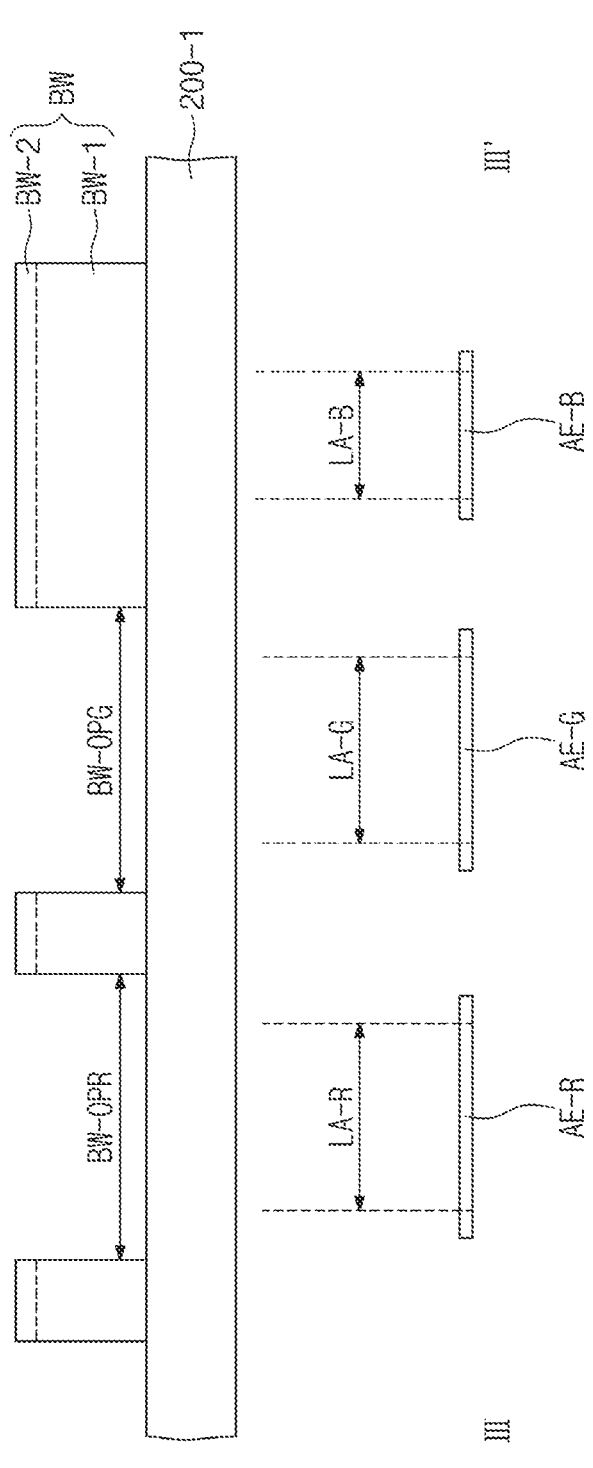

As illustrated in FIG. 11A, in an embodiment of a method for manufacturing a light conversion pattern OCL illustrated in FIG. 10C, the division partition wall BW is formed on the first insulating layer 200-1. The division partition wall BW may include a hydrophilic region BW-1 and a hydrophobic region BW-2. However, the invention is not limited thereto. A first opening BW-OPR and a second opening BW-OPG are formed in the division partition wall BW. A portion of the division partition wall BW overlaps a third light emitting area LA-B.

Figure 11B:
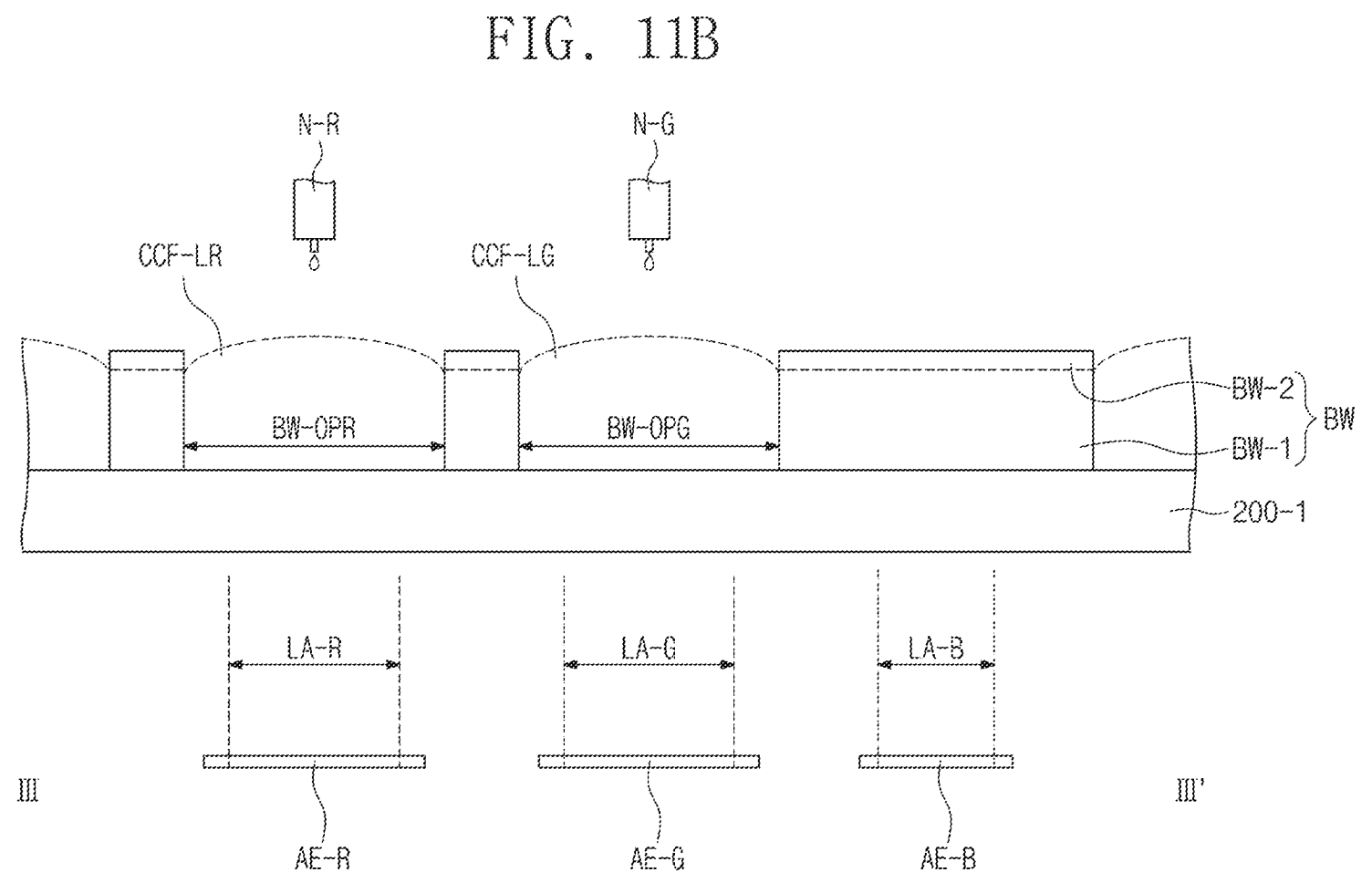

As illustrated in FIG. 11B, a first composition CCF-LR is provided in the first opening BW-OPR, and a second composition CCF-LG is provided in the second opening BW-OPG.

Figure 11C:
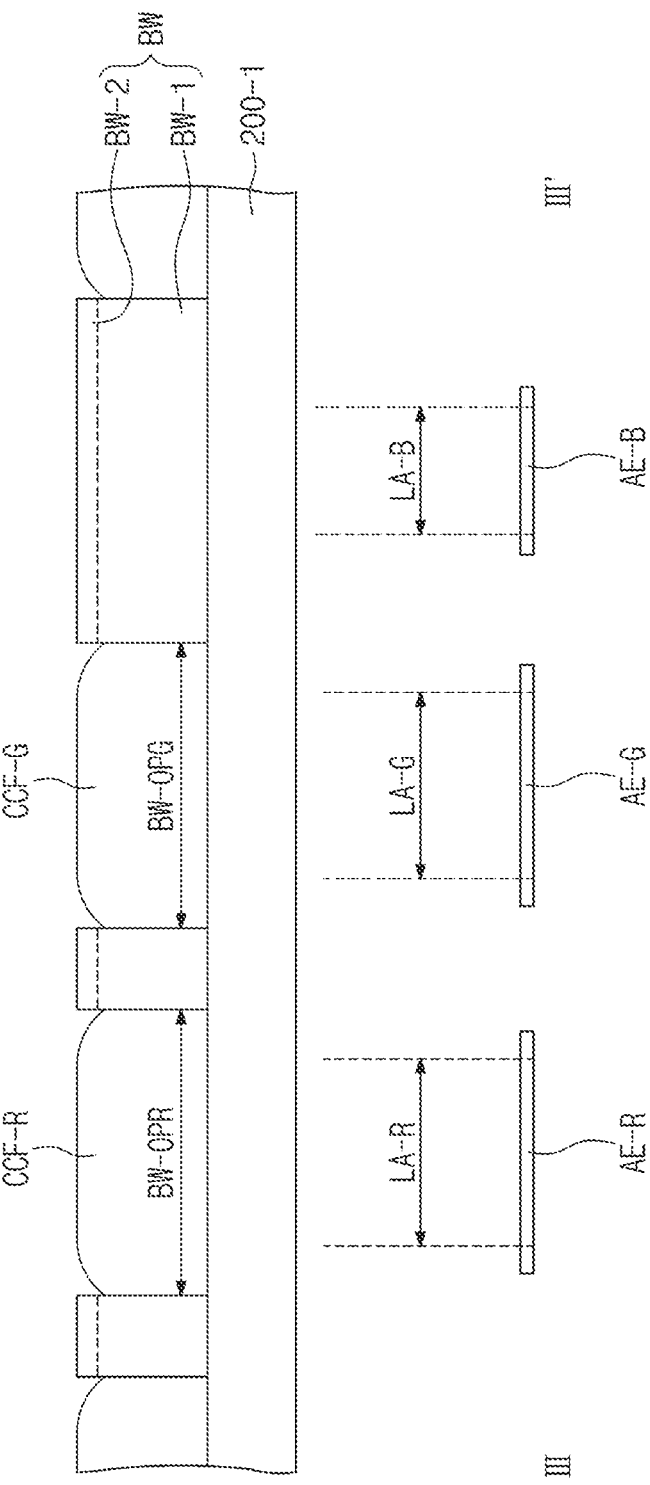

As illustrated in FIG. 11C, the first composition CCF-LR and the second composition CCF-LG are cured. Accordingly, a first light conversion pattern CCF-R and a second light conversion pattern CCF-G are formed.

Figure 11D:
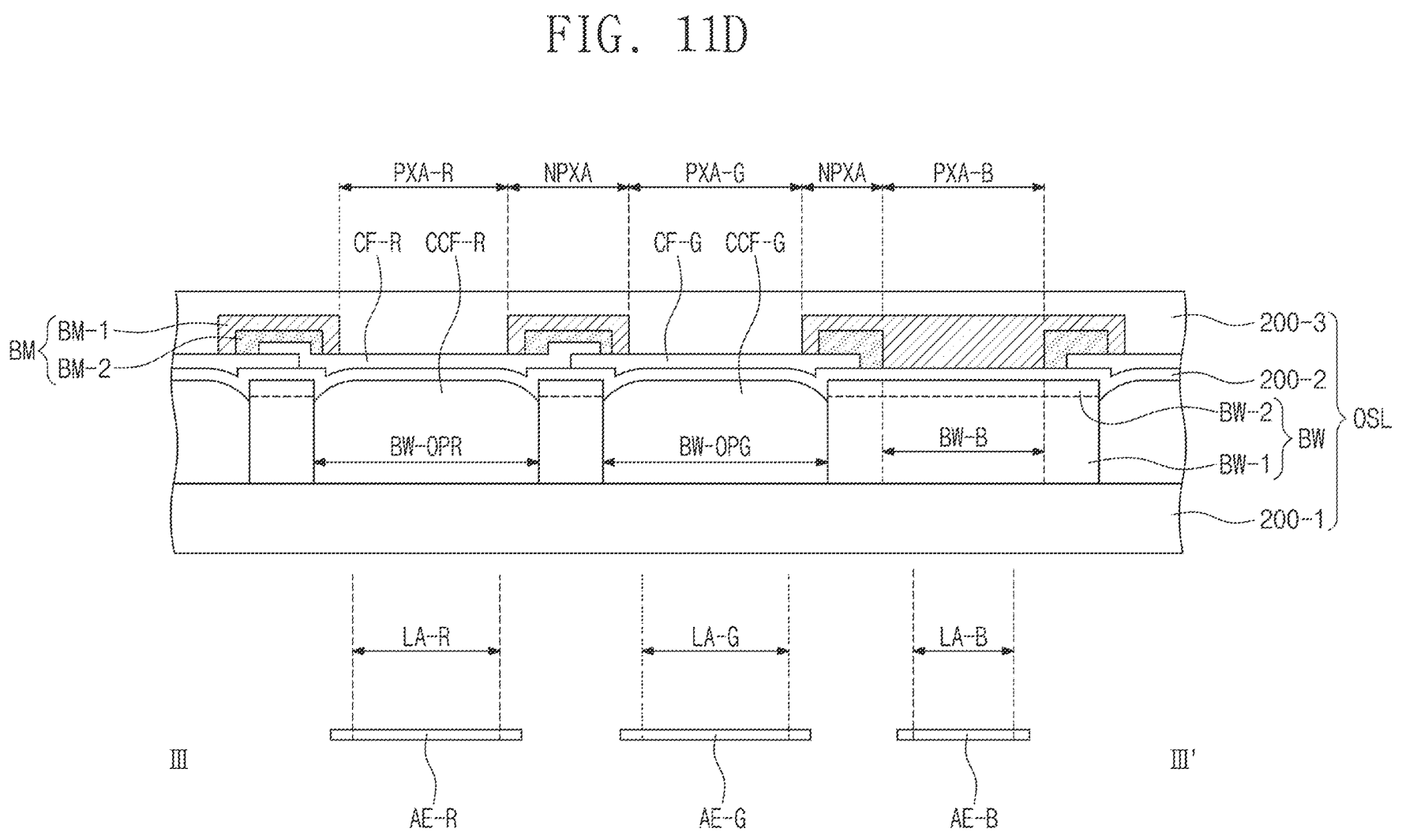

Thereafter, as illustrated in FIG. 11D, a second insulating layer 200-2 is formed. Also, a first color filter CF-R and a second color filter CF-G are formed. Thereafter, a division pattern BM is formed. After a layer BM-2 corresponding to a light blocking pattern is formed first, a layer BM-1 corresponding to a blue color filter may be formed on the layer BM-2. Thereafter, a third insulating layer 200-3 is formed. The second insulating layer 200-2 may be an inorganic layer, and the third insulating layer 200-3 may be an organic layer. An additional inorganic layer may be further formed between the first insulating layer 200-1 and the third insulating layer 200-3.

In an embodiment of the invention, a protective substrate may be further provided on the third insulating layer 200-3. The protective substrate may include a plastic substrate or a glass substrate.

Although not shown separately, according to an embodiment of the invention, a light control layer OSL may be modified as illustrated in FIGS. 6 to 9. As illustrated in FIG. 6, in an alternative embodiment, the division pattern BM may include only the layer BM-1 corresponding to the blue color filter. Also, the division partition wall BW may include a first layer BW-10 having hydrophilicity and a second layer BW-20 having hydrophobicity. The first layer BW-10 having the hydrophilicity is disposed more adjacent to the upper insulating layer TFL.

As illustrated in FIG. 7, in an alternative embodiment, the light control layer OSL may further include a reflective layer RL disposed on an inner wall surface of the division partition wall BW. As illustrated in FIG. 8, in an alternative embodiment, a third opening BW-OPB corresponding to a third pixel area PXA-B may be formed in the division partition wall BW. The light control layer OSL may further include an optical pattern OP-B.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

INDUSTRIAL APPLICABILITY

Embodiments of the invention may provide the display panel having high resolution and provide a new method for manufacturing the display panel using the solution process and the photo process, and thus the industrial applicability is recognized.

The invention claimed is:

1. A display panel comprising a first pixel area, a second pixel area, a third pixel area, and a peripheral area adjacent to the first, second, and third pixel areas, the display panel comprising:
   a first light emitting element, a second light emitting element, and a third light emitting element, each of which generates source light and which correspond to the first pixel area, the second pixel area, and the third pixel area, respectively;
   a division partition wall in which first openings corresponding to the first pixel area, the second pixel area, and the third pixel area are defined and which overlaps the peripheral area;
   a color filter overlapping the first pixel area and the second pixel area;
   a division pattern in which second openings corresponding to at least the first openings are defined;
   a first light conversion pattern disposed inside an opening corresponding to the first pixel area among the first openings, wherein the first light conversion pattern converts the source light generated in the first light emitting element into first color light;
   a second light conversion pattern disposed inside an opening corresponding to the second pixel area among the first openings, wherein the second light conversion pattern converts the source light generated in the second light emitting element into second color light; and
   an optical pattern disposed inside an opening corresponding to the third pixel area among the first openings, wherein the optical pattern transmits the source light received from the third light emitting element,
   wherein a portion of the optical pattern covers a lowest surface of the division partition wall in a cross section.

2. The display panel of claim 1, wherein the first pixel area is spaced apart from the second pixel area in a first direction, and
   the third pixel area is spaced apart from the first pixel area and the second pixel area in a second direction crossing the first direction.

3. The display panel of claim 2, wherein a length of each of the first pixel area and the second pixel area in the first direction is less than a length of the third pixel area in the first direction, and
   a length of each of the first pixel area and the second pixel area in the second direction is greater than a length of the third pixel area in the second direction.

4. The display panel of claim 3, wherein the first pixel area, the second pixel area, and the third pixel area define a unit area, and
   the unit area is provided in plurality,
   wherein the plurality of unit areas define a plurality of unit pixel rows.

5. The display panel of claim 4, wherein the plurality of unit areas have a same arrangement pattern of the first pixel area, the second pixel area, and the third pixel area as each other.

6. The display panel of claim 4, wherein an arrangement pattern of the first pixel area, the second pixel area, and the third pixel area of a unit area in an n-th unit pixel row of the plurality of unit pixel rows is symmetric with respect to an arrangement pattern of the first pixel area, the second pixel area, and the third pixel area of a unit area in an (n+1)-th unit pixel row in the first direction, wherein n is a natural number greater than or equal to 1.

7. The display panel of claim 1, wherein the color filter comprises a first color filter which transmits the first color light and a second color filter which transmits the second color light, and a portion of the division pattern overlaps the third pixel area and transmits the source light passed through the optical pattern.

8. The display panel of claim 1, further comprising a reflective layer disposed on an inner wall surface of the division partition wall defining the first openings.

9. The display panel of claim 1, wherein the division partition wall comprises a first region having hydrophilicity and a second region extending from the first region and having hydrophobicity.

10. The display panel of claim 1, wherein the division partition wall comprises a first layer having hydrophilicity and a second layer disposed on the first layer and having hydrophobicity.

11. The display panel of claim 1, wherein the division partition wall comprises a base resin and scattering particles mixed with the base resin.

12. The display panel of claim 1, wherein, the optical pattern has a thickness greater than a thickness of the first light conversion pattern.

13. A display panel comprising a first pixel area, a second pixel area, and a peripheral area adjacent to the first and second pixel areas, the display panel comprising:

a first display element and a second display element, each of which provides source light and which correspond to the first pixel area and the second pixel area, respectively;

a division partition wall which overlaps the peripheral area and in which first openings corresponding to the first pixel area and the second pixel area are defined;

a division pattern in which a second opening corresponding to at least the first pixel area is defined;

a light conversion pattern disposed inside an opening corresponding to the first pixel area among the first openings, wherein the light conversion pattern converts a color of the source light received from the first display element; and an optical pattern disposed inside an opening corresponding to the second pixel area among the first openings, wherein the optical pattern transmits the source light received from the second display element, wherein a portion of the optical pattern covers a lowest surface of the division partition wall in a cross section.

14. The display panel of claim 13, wherein the optical pattern comprises an organic material pattern.

15. The display panel of claim 14, further comprising scattering particles mixed with at least one of a portion of the division pattern overlapping the second pixel area or the organic material pattern.

16. The display panel of claim 13, wherein the optical pattern has a thickness greater than a thickness of the light conversion pattern.

17. A method for manufacturing a display panel comprising a first pixel area and a second pixel, the method comprising:

providing a division partition wall in which openings corresponding to the first pixel area and the second pixel area are defined;

providing a light conversion pattern, which converts a color of incident light, inside an opening corresponding to the first pixel area among the openings; and providing an optical pattern which transmits the incident light to correspond to an opening corresponding to the second pixel area among the openings, wherein the providing the light conversion pattern comprises providing a liquid quantum dot composition into the opening corresponding to the first pixel area, and the providing the optical pattern comprises performing a photolithography process, and a portion of the optical pattern covers a lowest surface of the division partition wall in a cross section.

\* \* \* \* \*